(12) United States Patent
Tanaka et al.

(10) Patent No.: US 12,119,242 B2
(45) Date of Patent: Oct. 15, 2024

(54) FILM PROCESSING METHOD

(71) Applicant: SCREEN HOLDINGS CO., LTD., Kyoto (JP)

(72) Inventors: Yuji Tanaka, Kyoto (JP); Masaya Asai, Kyoto (JP); Masahiko Harumoto, Kyoto (JP); Koji Kaneyama, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 815 days.

(21) Appl. No.: 17/228,746

(22) Filed: Apr. 13, 2021

(65) Prior Publication Data

US 2021/0233784 A1 Jul. 29, 2021

Related U.S. Application Data

(63) Continuation of application No. 15/772,218, filed as application No. PCT/JP2016/081847 on Oct. 27, 2016, now Pat. No. 11,004,702.

(30) Foreign Application Priority Data

Nov. 10, 2015 (JP) .................................. 2015-220495

(51) Int. Cl.
*H01L 21/67* (2006.01)
*G03F 7/00* (2006.01)
(Continued)

(52) U.S. Cl.
CPC ...... *H01L 21/67057* (2013.01); *G03F 7/0002* (2013.01); *G03F 7/0043* (2013.01);
(Continued)

(58) Field of Classification Search
None
See application file for complete search history.

(56) References Cited

U.S. PATENT DOCUMENTS 5,472,513 A 12/1995 Shiramizu ........................ 134/3
5,759,971 A 6/1998 Manako ........................ 510/175
(Continued)

FOREIGN PATENT DOCUMENTS

CN 1447193 A 10/2003
CN 101666980 A 3/2010
(Continued)

OTHER PUBLICATIONS

Machine translation: JP2010082582; Gakuho et al. (Year: 2010).*
(Continued)

*Primary Examiner* — Natasha N Campbell
(74) *Attorney, Agent, or Firm* — OSTROLENK FABER LLP

(57) ABSTRACT

A nozzle is stored in a nozzle storage hole of a waiting pod. In this state, a cleaning liquid is discharged to an outer peripheral surface of the nozzle from a plurality of discharge ports. Thus, a coating liquid and its solidified matter adhering to the nozzle are dissolved and removed from the nozzle. Subsequently, a metal removal liquid is discharged from a plurality of discharge ports to the outer peripheral surface of the nozzle. Thus, a metallic component remaining on the nozzle is dissolved and removed from the nozzle. Further, pure water is discharged to the outer peripheral surface of the nozzle from the plurality of discharge ports, and the metal removal liquid adhering to the nozzle is cleaned away.

15 Claims, 16 Drawing Sheets

(51) Int. Cl.
*G03F 7/004* (2006.01)
*G03F 7/09* (2006.01)
*G03F 7/11* (2006.01)
*G03F 7/16* (2006.01)
*G03F 7/26* (2006.01)
*G03F 7/30* (2006.01)

(52) U.S. Cl.
CPC .............. *G03F 7/091* (2013.01); *G03F 7/094* (2013.01); *G03F 7/11* (2013.01); *G03F 7/162* (2013.01); *G03F 7/26* (2013.01); *G03F 7/3021* (2013.01); *G03F 7/3092* (2013.01); *H01L 21/67051* (2013.01); *H01L 21/6708* (2013.01); *H01L 21/6715* (2013.01); *H01L 21/67178* (2013.01)

(56) References Cited

U.S. PATENT DOCUMENTS

| | | | |
|---|---|---|---|
| 6,076,979 A | 6/2000 | Mimasaka et al. | 396/604 |
| 6,302,600 B1 | 10/2001 | Nagase et al. | 396/611 |
| 8,927,201 B2 | 1/2015 | Takanashi et al. | 430/323 |
| 2001/0037858 A1 | 11/2001 | Taniyama et al. | 156/345 |
| 2003/0059534 A1 | 3/2003 | Nishijima et al. | 427/240 |
| 2003/0180127 A1* | 9/2003 | Kuroda | H01L 21/681 414/217 |
| 2004/0002020 A1 | 1/2004 | Oowada et al. | 430/329 |
| 2006/0067682 A1 | 3/2006 | Kaneyama et al. | 396/604 |
| 2008/0023049 A1 | 1/2008 | Matsumoto et al. | 134/61 |
| 2009/0136869 A1 | 5/2009 | Ogihara et al. | 430/270.1 |
| 2009/0169758 A1 | 7/2009 | Ryu | 427/427.3 |
| 2009/0269678 A1 | 10/2009 | Charpin-Nicolle | 430/5 |
| 2010/0015791 A1 | 1/2010 | Tanaka et al. | 438/597 |
| 2010/0051059 A1* | 3/2010 | Kometani | H01L 21/6715 134/21 |
| 2010/0160200 A1 | 6/2010 | Seki et al. | 510/175 |
| 2010/0330794 A1 | 12/2010 | Kurisu et al. | 438/592 |
| 2012/0161138 A1 | 6/2012 | Okumoto et al. | 257/59 |
| 2012/0255581 A1 | 10/2012 | Kometani et al. | 134/18 |
| 2013/0084393 A1 | 4/2013 | Kashiyama et al. | 427/273 |
| 2013/0143785 A1 | 6/2013 | Taniguchi et al. | 510/175 |
| 2013/0189835 A1 | 7/2013 | Kurisu et al. | 438/592 |
| 2013/0315627 A1 | 11/2013 | Sugiyama et al. | 399/237 |
| 2013/0319470 A1 | 12/2013 | Kai et al. | 134/22.12 |
| 2014/0030660 A1* | 1/2014 | Takanashi | G03F 7/26 106/287.18 |
| 2015/0264790 A1 | 9/2015 | Miyagi et al. | |
| 2018/0164736 A1 | 6/2018 | Sugiyama et al. | |
| 2018/0292746 A1 | 11/2018 | Miyagi et al. | |

FOREIGN PATENT DOCUMENTS

| | | |
|---|---|---|
| JP | 08-045886 A | 2/1996 |
| JP | 11-067622 A | 3/1999 |
| JP | 11-087292 A | 3/1999 |
| JP | 2000-061377 A | 2/2000 |
| JP | 2000-338684 A | 12/2000 |
| JP | 2001-319910 A | 11/2001 |
| JP | 2002-301413 A | 10/2002 |
| JP | 2003-178965 A | 6/2003 |
| JP | 2004-296991 A | 10/2004 |
| JP | 2005-296771 A | 10/2005 |
| JP | 2005-324123 A | 11/2005 |
| JP | 2007-318016 A | 12/2007 |
| JP | 2008-270509 A | 11/2008 |
| JP | 2009-519594 A | 5/2009 |
| JP | 2009-126940 A | 6/2009 |
| JP | 2009-158924 A | 7/2009 |
| JP | 2009-260249 A | 11/2009 |
| JP | 2010-062352 A | 3/2010 |
| JP | 2010082582 A * | 4/2010 |
| JP | 2011-009452 A | 1/2011 |
| JP | 2012-031506 A | 2/2012 |
| JP | 2013-076973 A | 4/2013 |
| JP | 2013-077639 A | 4/2013 |
| JP | 2013-119579 A | 6/2013 |
| JP | 2013-120830 A | 6/2013 |
| JP | 2013-243284 A | 12/2013 |
| JP | 2013-251409 A | 12/2013 |
| JP | 5442232 B2 | 3/2014 |
| JP | 2014-082471 A | 5/2014 |
| JP | 2014-093507 A | 5/2014 |
| JP | 2015-033679 A | 2/2015 |
| KR | 1995-0018697 A | 7/1995 |
| KR | 10-2000-0071851 A | 11/2000 |
| KR | 10-2010-0028488 A | 3/2010 |
| KR | 10-2010-0057326 A | 5/2010 |
| KR | 10-2012-0023296 A | 3/2012 |
| KR | 10-2012-0128575 A | 11/2012 |
| KR | 10-2013-0111652 A | 10/2013 |
| TW | 201029757 A1 | 8/2010 |
| WO | WO2012/002124 A1 | 1/2012 |

OTHER PUBLICATIONS

International Search Report mailed Jan. 17, 2017 in corresponding PCT International Application No. PCT/JP2016/081847.
Written Opinion mailed Jan. 17, 2017 in corresponding PCT International Application No. PCT/JP2016/081847.
Office Action dated Jun. 29, 2017 in corresponding Taiwanese Patent Application No. 105136219.
Andrew Grenville et al., Integrated fab process for metaloxide EUV photoresist, Proceedings of SPIE, vol. 9425, pp. 94250S-1 to 94250S-8, Mar. 2015.
Clark Benjamin, Coater/developer process integration of metaloxide based photoresist, Proceedings of SPIE, vol. 9425, pp. 94251A-1 to 94251A-7, Mar. 2015.
Notice of Reasons for Refusal dated Jun. 11, 2019 in the counterpart Japanese Patent Application No. 2015-220495.
Office Action dated Nov. 20, 2019 in corresponding Korean Patent Application No. 10-2018-7016277.
Office Action dated Nov. 6, 2018 issued in corresponding Japanese Patent Application No. 2015-220495.
Office Action dated Mar. 17, 2020 in corresponding Japanese Patent Application No. 2015-220495.
Office Action dated Apr. 22, 2020 in corresponding Korean Patent Application No. 10-2018-7016277.
Chinese Office Action issued Nov. 2, 2021 for corresponding Chinese Application No. 201680065516.1.

* cited by examiner

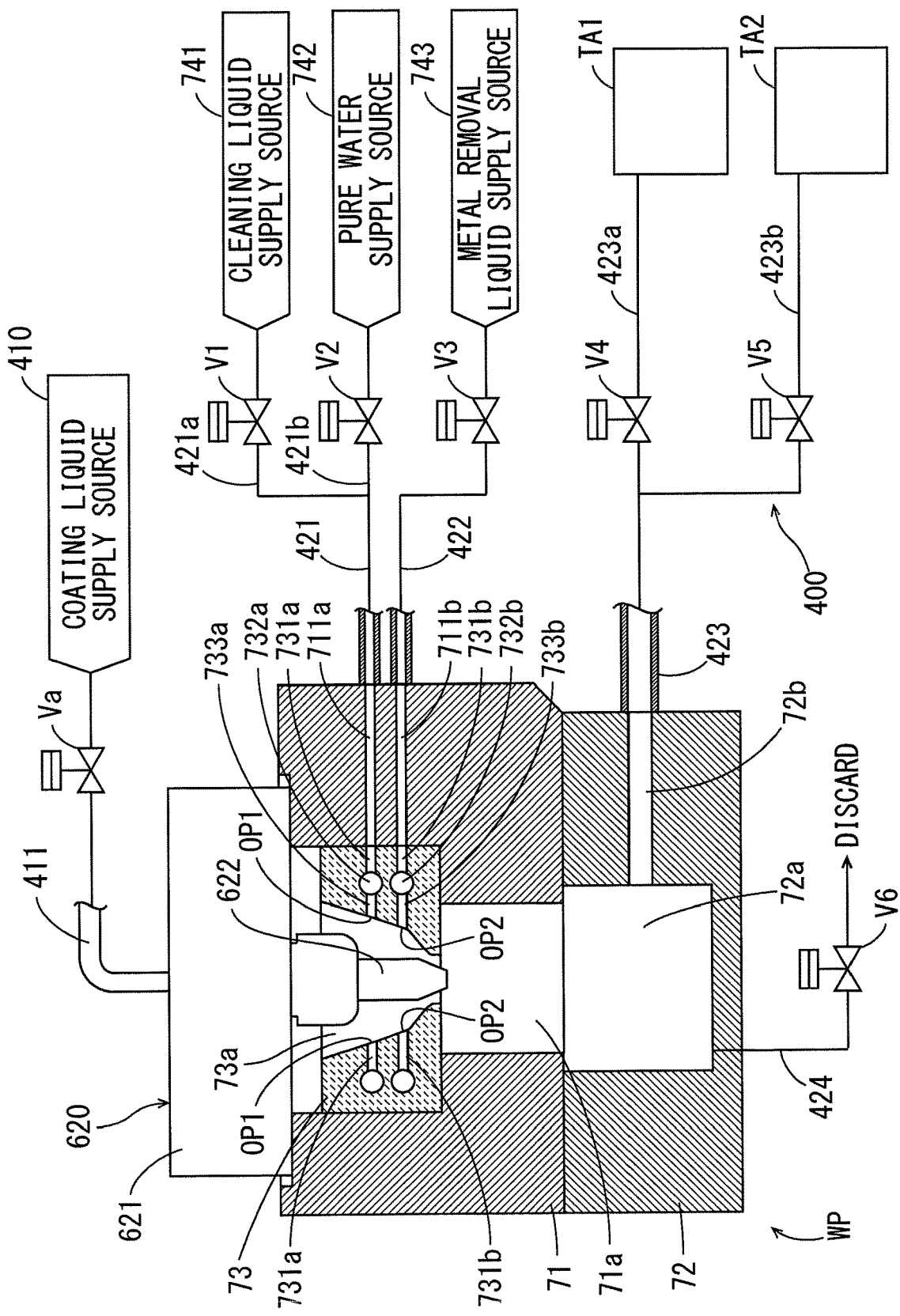

FILM PROCESSING METHOD

CROSS-REFERENCE TO RELATED APPLICATIONS

The present application is a continuation of U.S. patent application Ser. No. 15/772,218, filed Apr. 30, 2018, which is a 35 U.S.C. §§ 371 national phase conversion of PCT/JP2016/081847, filed Oct. 27, 2016, which claims priority to Japanese Patent Application No. 2015-220495, filed Nov. 10, 2015, the contents of all of which are incorporated herein by reference. The PCT International Application was published in the Japanese language.

TECHNICAL FIELD

The present invention relates to a film processing unit and a substrate processing apparatus that perform processing on a substrate.

BACKGROUND ART

In a lithography process in the manufacture of a semiconductor device or the like, a coating liquid such as a resist liquid is supplied onto a substrate, so that a coating film is formed. For example, the substrate is horizontally held and rotated by a spin chuck. In this state, the resist liquid is discharged to a substantially center portion of an upper surface of the substrate from a nozzle, whereby a resist film is formed on the entire upper surface of the substrate as a coating film.

The resist liquid is discharged from the nozzle, and then the resist liquid adheres to a tip of the nozzle. When the resist liquid adhering to the nozzle solidifies, the solidified matter may become particles. Therefore, after the resist liquid is discharged, the nozzle is cleaned with use of a solvent (see Patent Document 1, for example).

[Patent Document 1] JP 2003-178965 A

SUMMARY OF INVENTION

Technical Problem

In recent years, application of a coating film containing metal (hereinafter referred to as a metal-containing coating film) has been studied in order for finer patterns to be formed. According to an experiment conducted by the inventors, it is found that, even when the nozzle is cleaned with use of the solvent, a metallic component is not removed and remains on the nozzle. A substrate or a substrate processing apparatus may be contaminated by the metallic component remaining on the nozzle. Further, when the substrate that has been contaminated by the metallic component is transported to an exposure device, the exposure device may be contaminated.

An object of the present invention is to provide a film processing unit and a substrate processing apparatus that can prevent contamination caused by metal.

Solution to Problem (1) A film processing unit according to one aspect of the present invention includes a processing liquid nozzle that discharges a processing liquid to a surface to be processed of a substrate, a movement mechanism that moves the processing liquid nozzle between a process position above the substrate and a cleaning position farther outward than the substrate, and a removal liquid supplier that is configured to supply a first removal liquid for dissolving metal to the processing liquid nozzle at the cleaning position.

In this film processing unit, the processing liquid nozzle moves between the process position and the cleaning position. With the processing liquid nozzle at the process position, the processing liquid is supplied to the surface to be processed of the substrate from the processing liquid nozzle. The processing liquid nozzle is moved to the cleaning position after the processing liquid is supplied. After that, the first removal liquid for dissolving metal is supplied from the removal liquid supplier to the processing liquid nozzle.

When metal is included in the processing liquid, metal may be remaining on the processing liquid nozzle. Further, when the coating film including metal is formed on the substrate, and the coating film is dissolved by the processing liquid, the metal in the dissolved coating film may adhere to the processing liquid nozzle. In the above-mentioned configuration, after the processing liquid is supplied, the first removal liquid is supplied to the processing liquid nozzle. Therefore, the metal remaining on or adhering to the processing liquid nozzle can be dissolved to be removed. Therefore, the metal is prevented from being diffused from the processing liquid nozzle. As a result, the substrate or another device is prevented from being contaminated by metal.

(2) The film processing unit may further include a rotation holder that holds and rotates the substrate in a horizontal attitude, wherein the processing liquid nozzle may be configured to form a metal-containing coating film on the surface to be processed by discharging a metal-containing coating liquid including metal and a coating liquid as the processing liquid to the surface to be processed of the substrate rotated by the rotation holder. In this case, even when the metal in the metal-containing coating liquid remains on the processing liquid nozzle, the metal can be dissolved to be removed. Therefore, the metal is prevented from being diffused from the processing liquid nozzle.

(3) The removal liquid supplier may be configured to supply a second removal liquid for dissolving the coating liquid to the processing liquid nozzle at the cleaning position. In this case, the coating liquid and its solidified matter adhering to the processing liquid nozzle can be dissolved to be removed.

(4) The film processing unit may further include a storage that is provided at the cleaning position and stores at least part of the processing liquid nozzle, wherein the storage may have a first opening, and the removal liquid supplier may include a first removal liquid system that supplies the first removal liquid to the processing liquid nozzle in the storage through the first opening. In this case, the first removal liquid can be supplied to the processing liquid nozzle with a simple configuration.

(5) The storage may have a second opening, and the removal liquid supplier may include a second removal liquid supply system that supplies the second removal liquid to the processing liquid nozzle in the storage through the second opening. In this case, the second removal liquid can be supplied to the processing liquid nozzle with a simple configuration. Further, the first and second removal liquids are respectively supplied to the processing liquid nozzle in the common storage. Therefore, as compared to the case where the first and second removal liquids are supplied to the processing liquid nozzle at different locations, space saving can be achieved, and the coating liquid and the metal can be efficiently removed from the processing liquid nozzle.

(6) The second opening may be located at a position farther upward than the first opening. Therefore, when the first removal liquid is supplied from the first opening to the processing liquid nozzle, and then the second removal liquid is supplied from the second opening to the processing liquid nozzle, the first removal liquid can be sufficiently cleaned away by the second removal liquid.

(7) The film processing unit may further include a storage that is provided at the cleaning position and stores at least part of the processing liquid nozzle, wherein the storage may have an opening, and the removal liquid supplier may include a removal liquid supply system that selectively supplies the first removal liquid and the second removal liquid to the processing liquid nozzle in the storage through the opening. In this case, the first removal liquid and the second removal liquid can be efficiently supplied to the processing liquid nozzle with a simple configuration.

(8) The film processing unit may further include a removal liquid collection unit provided to separately collect the first and second removal liquids that have been supplied to the processing liquid nozzle. In this case, it is not necessary for a user to carry out an operation of separating the used first removal liquid and the used second removal liquid. Thus, the cost for collecting and discarding the first and second removal liquids can be lowered.

(9) The processing liquid nozzle may be configured to discharge the metal-containing coating liquid at the cleaning position before the metal-containing coating liquid is discharged to the substrate at the process position. In this case, the processing liquid nozzle can be filled with a new metal-containing coating liquid by preliminarily discharging the metal-containing coating liquid, and the new metal-containing coating liquid can be discharged to the substrate. Because it is not necessary to provide a separate space for such preliminarily discharging, space saving can be achieved.

(10) The film processing unit may further include a peripheral portion removal liquid supply unit that supplies a third removal liquid for dissolving the metal-containing coating liquid to a peripheral portion of the surface to be processed of the substrate that is rotated by the rotation holder such that the metal-containing coating film remains in a region except for the peripheral portion of the surface to be processed of the substrate.

In this case, the metal-containing coating film is formed on the surface to be processed of the substrate except for the peripheral portion, and the metal is prevented from remaining on the peripheral portion of the substrate. Thus, the metal is prevented from being diffused from the peripheral portion of the substrate.

(11) The third removal liquid may include a fourth removal liquid for dissolving the metal and a fifth removal liquid for dissolving the coating liquid, and the peripheral portion removal liquid supply unit may include one or a plurality of removal liquid nozzles that supply the fourth and fifth removal liquids to the peripheral portion of the surface to be processed of the substrate.

In this case, the metal in the metal-containing coating liquid is removed by the fourth removal liquid, and the coating liquid in the metal-containing coating liquid is removed by the fifth removal liquid. Thus, the metal-containing coating film at the peripheral portion of the substrate can be appropriately removed.

(12) The fifth removal liquid may be same as the first removal liquid, and the film processing unit may further include a common collection pipe for collecting the first removal liquid that has been supplied to the processing liquid nozzle and the fifth removal liquid that has been supplied to the substrate.

In this case, because the first removal liquid and the fifth removal liquid are collected through the common collection pipe, efficiency of collecting the first and fifth removal liquids is improved while complication of the configuration is inhibited.

(13) The processing liquid nozzle may be configured to supply a development liquid to the surface to be processed of the substrate, on which a metal-containing coating liquid having photosensitivity and containing metal has been formed and which has been exposed. In this case, even when the metal in the metal-containing coating film dissolved by the development liquid adheres to the processing liquid nozzle, the metal can be dissolved to be removed. Therefore, metal is prevented from being diffused from the processing liquid nozzle.

(14) A substrate processing apparatus according to another aspect of the present invention that is arranged to be adjacent to an exposure device that performs exposure processing on a substrate includes the above-mentioned film processing unit that forms the metal-containing coating film on a surface to be processed of the substrate before exposure processing is performed by the exposure device, and a development processing unit that performs development processing on the substrate after the exposure processing is performed by the exposure device.

In this substrate processing apparatus, the metal-containing coating film is formed on the surface to be processed of the substrate that has not been exposed by the exposure device, and the development processing is performed on the substrate that has been exposed by the exposure device. Thus, a fine pattern can be formed on the surface to be processed of the substrate. Further, because the above-mentioned film processing unit is used, the substrate, or the inside of the substrate processing apparatus or the exposure device is prevented from being contaminated.

(15) The film processing unit may be configured to form a photosensitive film having photosensitivity on the surface to be processed of the substrate as the metal-containing coating film. In this case, because the photosensitive film contains metal, attenuation of exposure light is inhibited, and an exposure pattern can be formed at high resolution.

(16) The film processing unit may be configured to form an anti-reflection film on the surface to be processed of the substrate as the metal-containing coating film. In this case, because the anti-reflection film contains metal, attenuation of the exposure light is inhibited, and the exposure pattern can be formed at high resolution.

(17) A substrate processing apparatus according to yet another aspect of the present invention that is arranged to be adjacent to an exposure device that performs exposure processing on a substrate includes a film formation unit that forms a metal-containing coating film including metal on a surface to be processed of the substrate before the exposure processing is performed by the exposure device, and the above-mentioned film processing unit that performs development processing on the substrate after the exposure processing is performed by the exposure device.

In this substrate processing apparatus, the metal-containing coating film is formed by the film processing unit on the surface to be processed of the substrate that has not been exposed by the exposure device, and the development processing is performed by the film processing unit on the substrate that has been exposed by the exposure device. Thus, a fine pattern can be formed on the surface to be processed of the substrate. Further, because the above-mentioned film processing unit is used, the substrate, or the inside of the substrate processing apparatus or the exposure device is prevented from being contaminated by metal.

Advantageous Effects of Invention

The present invention prevents metal from being diffused from the processing liquid nozzle, and prevents the substrate and the like from being contaminated by metal.

BRIEF DESCRIPTION OF THE DRAWINGS

FIG. 4 is a partial longitudinal cross sectional view for explaining a nozzle block and a waiting pod of FIG. 3.

DESCRIPTION OF EMBODIMENTS

A film processing unit and a substrate processing apparatus according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like.

(1) Substrate Processing Apparatus

Figure 1:
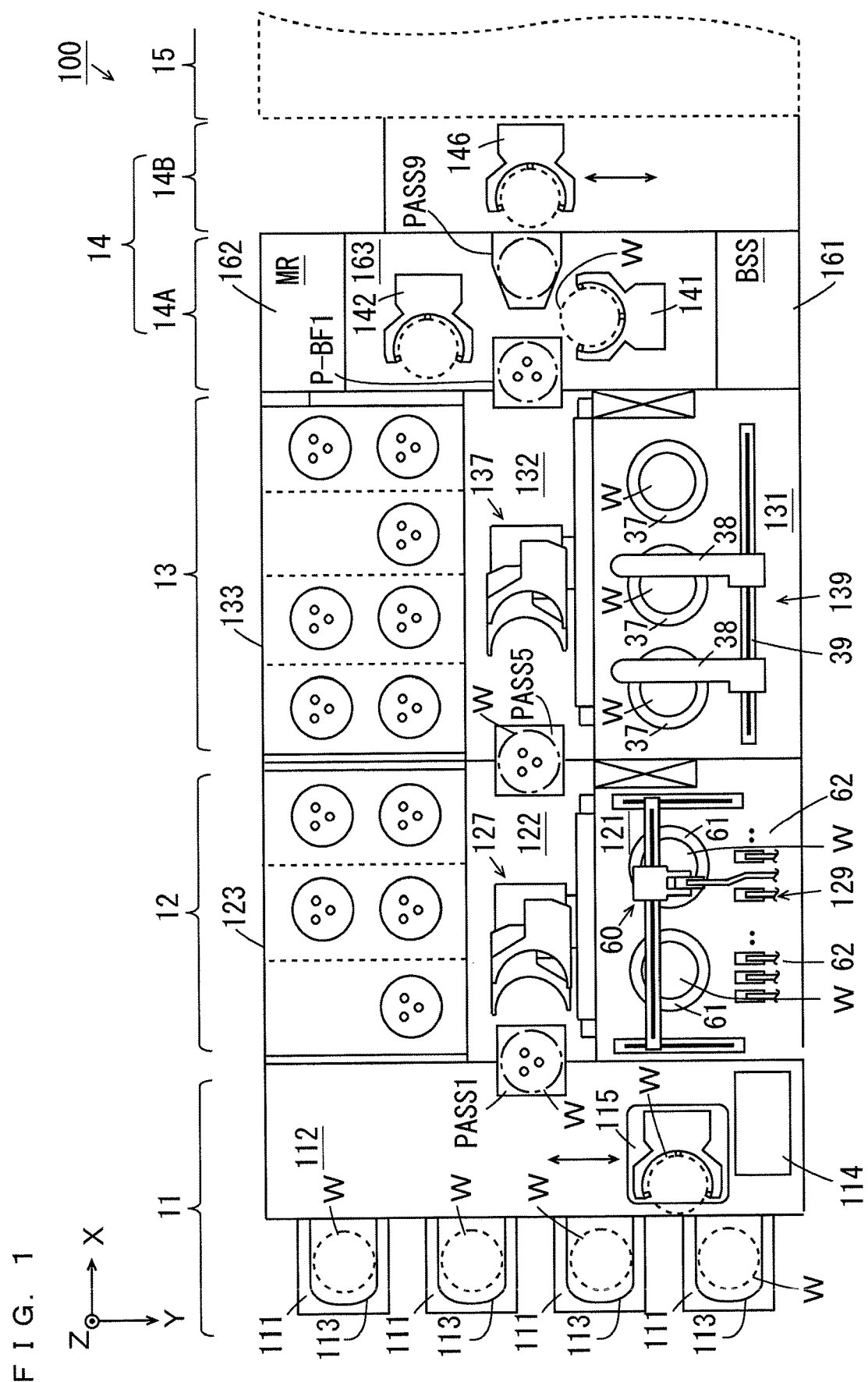
FIG. 1 is a schematic plan view of a substrate processing apparatus according to a first embodiment of the present invention.

FIG. 1 is a schematic plan view of the substrate processing apparatus according to a first embodiment of the present invention. FIG. 1 and the subsequent drawings are accompanied by the arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the present example, the exposure device 15 performs exposure processing on the substrate W using EUV (Extreme Ultra Violet). A wavelength of the EUV is not less than 13 nm and not more than 14 nm.

As shown in FIG. 1, the indexer block 11 includes a plurality of carrier platforms 111 and a transport section 112. In each carrier platform 111, a carrier 113 for storing a plurality of substrates W in multiple stages is placed. In the transport section 112, a main controller 114 and a transport mechanism 115 are provided. The main controller 114 controls various constituent elements of the substrate processing apparatus 100. The transport mechanism 115 transports the substrate W while holding the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. Substrate platforms PASS1 to PASS4 (see FIG. 10) on which the substrates W are placed are provided between the transport section 122 and the indexer block 11. Transport mechanisms 127, 128 (see FIG. 10) that transport the substrates W are provided in the transport section 122.

The second processing block 13 includes a development processing section 131, a transport section 132 and a thermal processing section 133. The development processing section 131 and the thermal processing section 133 are provided to be opposite to each other with the transport section 132 interposed therebetween. Substrate platforms PASS5 to PASS8 (see FIG. 10) on which the substrates W are placed are provided between the transport section 132 and the transport section 122. Transport mechanisms 137, 138 (see FIG. 10) that transport the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163. Placement buffer units P-BF1, P-BF2 (see FIG. 10) are provided between the transport section 163 and the transport section 132. The placement buffer units P-BF1, P-BF2 are configured to be capable of storing the plurality of substrates W.

Further, a substrate platform PASS9, below-mentioned edge exposure units EEW (see FIG. 10) and below-mentioned placement cooling units P-CP (see FIG. 10) are provided to be adjacent to the carry-in carry-out block 14B between the transport mechanisms 141, 142. Each placement cooling unit P-CP includes a function of cooling the substrate W (a cooling plate, for example). In the placement cooling unit P-CP, the substrate W is cooled to a temperature suitable for exposure processing. A transport mechanism 146 is provided in the carry-in carry-out block 14B. The transport mechanism 146 carries in the substrate W to and carries out the substrate W from the exposure device 15.

Figure 2:
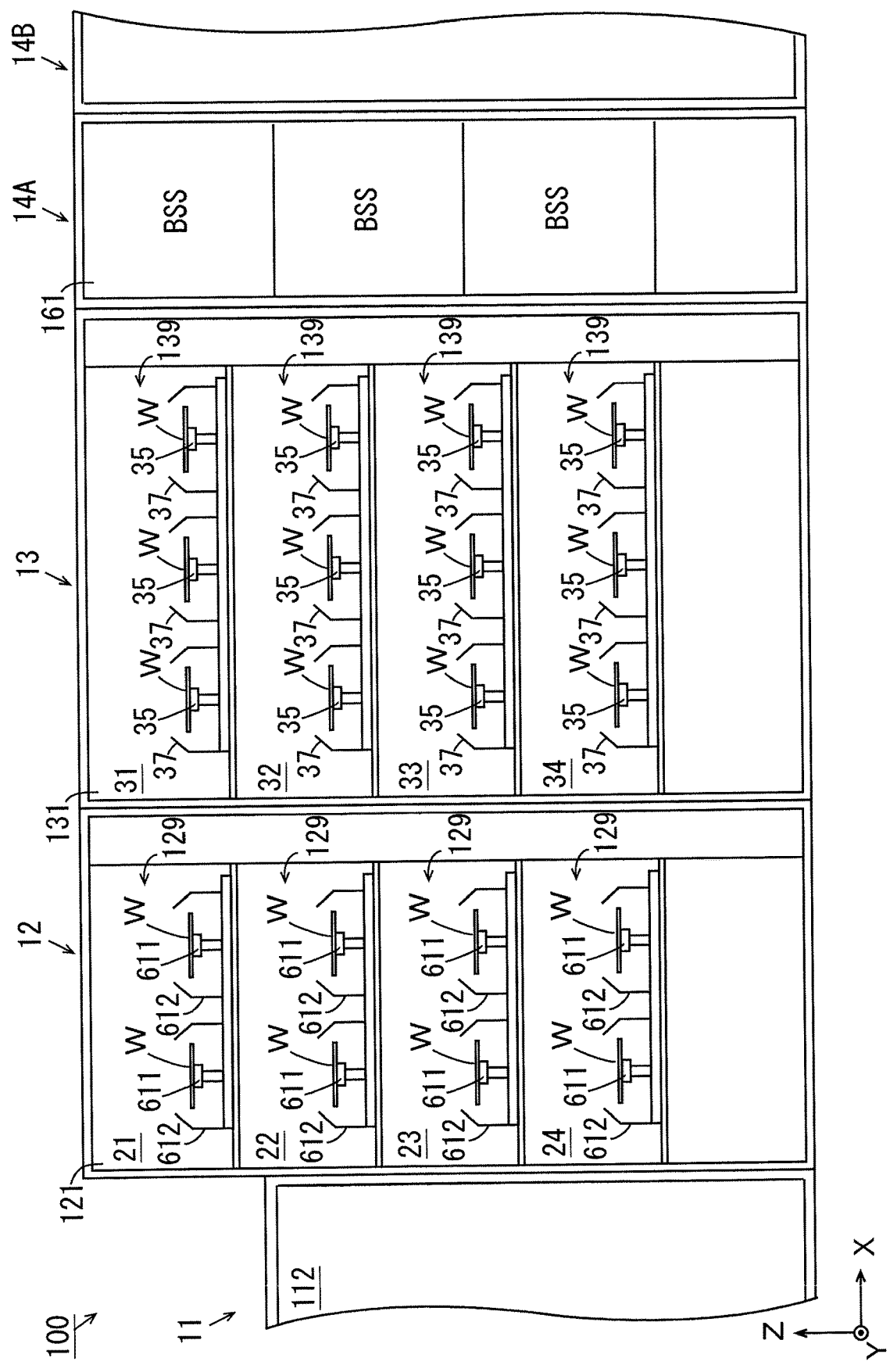
FIG. 2 is a schematic side view showing inner configurations of a coating processing section, a development processing section and a cleaning drying processing section of FIG. 1.

(2) Coating Processing Section, Development Processing Section and Cleaning Drying Processing Section FIG. 2 is a schematic side view showing inner configurations of the coating processing section 121, the development processing section 131 and the cleaning drying processing section 161 of FIG. 1. As shown in FIG. 2, in the coating processing section 121, coating processing chambers 21, 22, 23, 24 are provided in a stack. A coating processing unit 129 is provided in each of the coating processing chambers 21 to 24. In the development processing section 131, development processing chambers 31 to 34 are provided in a stack. A development processing unit 139 is provided in each of the development processing chambers 31 to 34.

(2-1) Coating Processing Units

Figure 3:
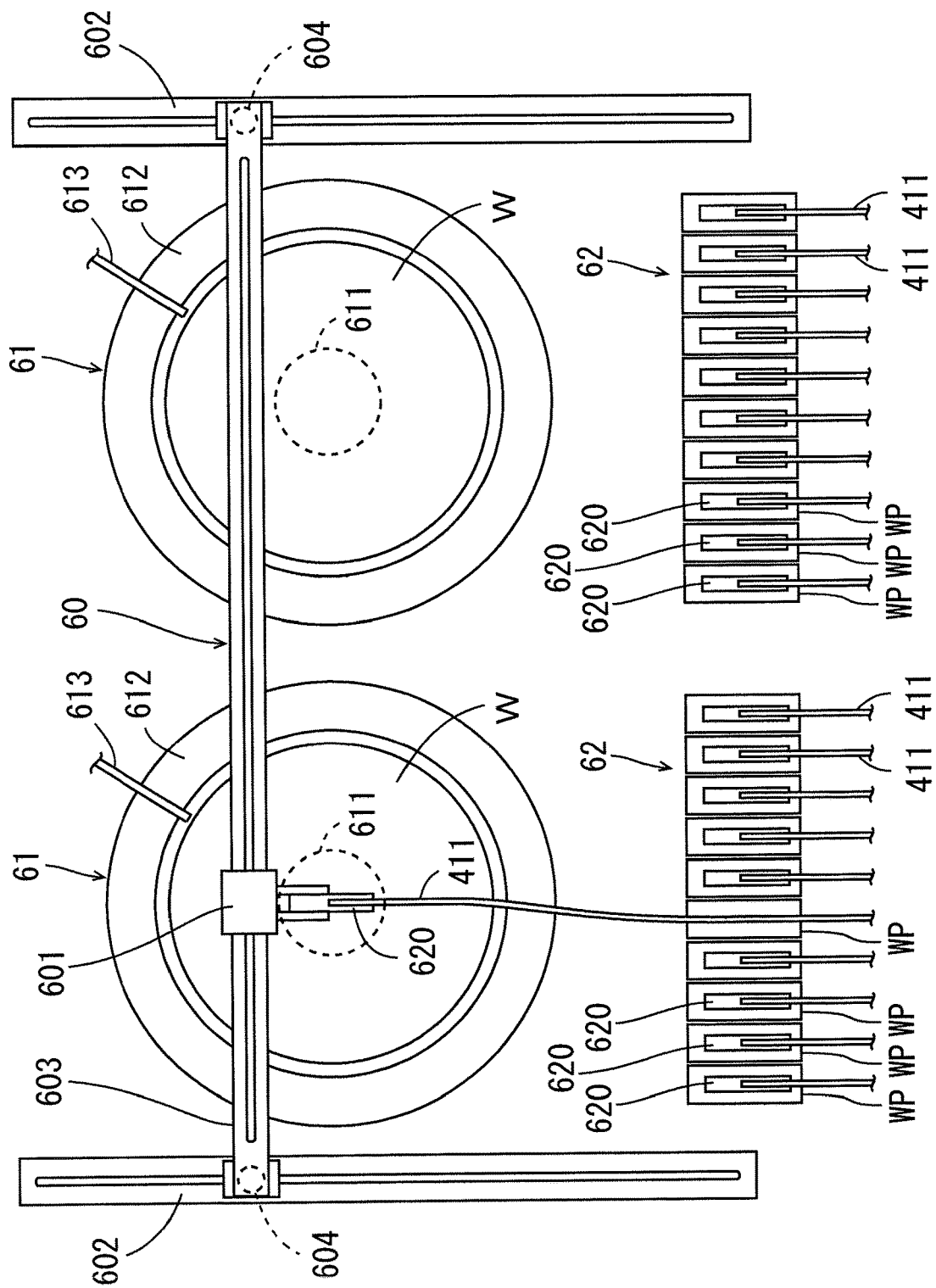
FIG. 3 is a schematic plan view showing a configuration of a coating processing unit.

FIG. 3 is a schematic plan view showing a configuration of the coating processing unit 129. As shown in FIG. 3, each coating processing unit 129 includes a nozzle transport mechanism 60, two spin units 61 and two nozzle units 62. The nozzle transport mechanism 60 includes a gripper 601, a pair of first guide rails 602, a second guide rail 603 and a pair of cylinders 604. The pair of first guide rails 602 is arranged in parallel to each other with the two spin units 61 and the two nozzle units 62 interposed therebetween. The second guide rail 603 is arranged to be orthogonal to the pair of first guide rails 602. Both ends of the second guide rail 603 are respectively attached to the pair of first guide rails 602 via the pair of cylinders 604. The second guide rail 603 is movable along the first guide rails 602 and can be lifted and lowered with respect to the first guide rails 602 by the pair of cylinders 604. The gripper 601 is provided to be movable along the second guide rail 603.

Each spin unit 61 includes a spin chuck 611, a cup 612 and an edge rinse nozzle 613. Rotation of the spin chuck 611 is driven by a motor 611a, described below, while holding the substrate W. The cup 612 is provided to surround the spin chuck 611.

Each nozzle unit 62 includes a plurality of nozzle blocks 620 and a plurality of waiting pods WP. In the present example, the plurality of waiting pods WP are provided to correspond to the plurality of nozzle blocks 620, respectively. Each nozzle block 620 waits in a corresponding waiting pod WP. A metal-containing coating liquid including metal and a coating liquid is supplied to each nozzle block 620 through a coating liquid pipe 411. The metal includes a metallic component such as metallic molecules or metallic oxide. In the present example, Sn (tin), HfO$_2$ (hafnium oxide) or ZrO$_2$ (zirconium dioxide), for example, is used as the metallic component. Further, a coating liquid for an anti-reflection film and a coating liquid for a resist film are used as coating liquids.

The number of the spin units 61 is not limited to two, and the number of the nozzle units 62 is not limited to two. Only one spin unit 61 and only one nozzle unit 62 may be provided. Alternatively, three or more spin units 61 and three or more nozzle units 62 may be provided. Further, the number of the spin units 61 may be different from the number of the nozzle units 62.

The nozzle transport mechanism 60 holds any one of the nozzle blocks 620 using the gripper 601 and moves the nozzle block 620 between a process position above the substrate W and a waiting position on the corresponding waiting pod WP. With the nozzle block 620 at the process position, the metal-containing coating liquid is discharged from the nozzle block 620 while the spin chuck 611 is rotated. Thus, the metal-containing coating liquid is applied onto the rotating substrate W.

In the present embodiment, the metal-containing coating liquid including a coating liquid for an anti-reflection film is supplied to the nozzle blocks 620 in the coating processing chambers 22, 24 of FIG. 2, and the metal-containing coating liquid including a coating liquid for a resist film is supplied to the nozzle blocks 620 in the coating processing chambers 21, 23. Hereinafter, the anti-reflection film and the resist film formed of the metal-containing coating liquid are collectively termed as the metal-containing coating films.

Each edge rinse nozzle 613 is arranged to be directed to a peripheral portion of a surface to be processed of the substrate W held by the spin chuck 611. Here, the surface to be processed refers to a surface of the substrate W on which various types of patterns such as a circuit pattern is formed. The peripheral portion of the substrate W refers to a region, having a constant width and extending along an outer periphery of the substrate W, of the surface to be processed of the substrate W.

Each edge rinse nozzle 613 discharges a film removal liquid for removing the metal-containing coating film from the peripheral portion of the substrate W. In addition to an organic solvent including a thinner, butyl acetate, PGMEA (propyleneglycol monomethyl ether acetate) and PGME (propyleneglycol monomethyl ether), an aqueous solution including TMAH (tetra methyl ammonium hydroxide), an aqueous solution including ammonia and a hydrogen peroxide solution, or the like may be used as the film removal liquid.

With the substrate W rotated by the spin chuck 611, the film removal liquid is discharged to the peripheral portion of the substrate W from the edge rinse nozzle 613. Thus, the coating liquid that has been applied to the peripheral portion of the substrate W is dissolved and removed.

FIG. 4 is a longitudinal cross sectional view for explaining the nozzle block 620 and the waiting pod WP of FIG. 3. As shown in FIG. 4, the nozzle block 620 includes a support block 621 and a nozzle 622. The nozzle 622 is provided to project downwardly from a lower surface of a support block 621. The nozzle block 620 is connected to a coating liquid supply source 410 through the coating liquid pipe 411. A valve Va is provided at the coating liquid pipe 411. When the valve Va is opened, the metal-containing coating liquid is supplied to the nozzle block 620 through the coating liquid pipe 411 from the coating liquid supply source 410, and the metal-containing coating liquid is discharged from the nozzle 622.

The waiting pod WP includes a liquid supply container 71, a collection container 72 and a nozzle storing container 73. The liquid supply container 71 is provided on the collection container 72. A through hole 71a extending in the vertical direction is formed in the liquid supply container 71. An inner diameter of an upper half portion of the through hole 71a is larger than an inner diameter of a lower half portion of the through hole 71a. Thus, a step is formed at an inner surface of the through hole 71a. The nozzle storage container 73 is stored in the upper half portion of the through hole 71a of the liquid supply container 71 and is supported by the step. A nozzle storage hole 73a that penetrates in the vertical direction is formed in the nozzle storage container 73. The nozzle storage hole 73a has an inner diameter that gradually decreases from an upper end towards a lower end. The nozzle 622 of the nozzle block 620 is stored in the nozzle storage hole 73a of the nozzle storage container 73. In this case, the support block 621 is supported by the upper surface of the liquid supply container 71.

Flow paths 711a, 711b are formed in the liquid supply container 71 to extend from an outer surface towards an inner surface. In the nozzle storage container 73, flow paths 731a, 732a and a plurality of flow paths 733a are formed to communicate with one another, and flow paths 731b, 732b and a plurality of flow paths 733b are formed to communicate with one another. The flow path 732a and the flow path 732b respectively extend annularly to surround the nozzle storage hole 73a. The flow path 731a extends from an outer surface of the nozzle storage container 73 to the flow path 732a to communicate with the flow path 711a, and the flow path 731b extends from the outer surface of the nozzle storage container 73 to the flow path 732b to communicate with the flow path 711b.

The plurality of flow paths 733a respectively extend from the flow path 732a to the inner surface of the nozzle storage hole 73a to be arranged radially. The plurality of flow paths 733b respectively extend from the flow path 732b to the inner surface of the nozzle storage hole 73a to be arranged radially. In the inner surface of the nozzle storage hole 73a, the flow paths 733a open as discharge ports OP1, and the flow paths 733b open as discharge ports OP2. The plurality of discharge ports OP1, OP2 are arranged in a circumferential direction to surround the outer peripheral surface of the nozzle 622 stored in the nozzle storage hole 73a, respectively. Further, the plurality of discharge ports OP1 are located at positions farther upward than the positions of the plurality of discharge ports OP2.

A pipe 421 is connected to the flow path 711a of the liquid supply container 71. The pipe 421 branches into the pipes 421a, 421b to extend to a cleaning liquid supply source 741 and a pure water supply source 742. Valves V1, V2 are provided at the pipes 421a, 421b, respectively. When the valves V1, V2 are opened selectively, a cleaning liquid and pure water are selectively guided to the flow path 711a from the cleaning liquid supply source 741 and the pure water supply source 742.

The cleaning liquid is an example of a second removal liquid. The cleaning liquid is the liquid similar to the film removal liquid discharged from the edge rinse nozzles 613, described above, and the above-mentioned film removal liquid is used as the cleaning liquid, for example. When the cleaning liquid supplied to the waiting pods WP and the film removal liquid supplied to the edge rinse nozzles 613 of FIG. 3 are the same, the film removal liquid and the cleaning liquid may be supplied to the edge rinse nozzles 613 and the waiting pods WP of FIG. 3 from the common cleaning liquid supply source 741. The cleaning liquid or pure water guided to the flow path 711a is guided to the plurality of flow paths 733a through the flow paths 731a, 732a, and is discharged from the plurality of discharge ports OP1 to the outer peripheral surface of the nozzle 622 stored in the nozzle storage hole 73a.

A pipe 422 is connected to the flow path 711b of the liquid supply container 71. The pipe 422 extends to a metal removal liquid supply source 743. A valve V3 is provided at the pipe 422. When the valve V3 is opened, a metal removal liquid is guided from the metal removal liquid supply source 743 to the flow path 711b. The metal removal liquid is an example of a first removal liquid. An alkaline removal liquid or an acid removal liquid is used as the metal removal liquid. The alkaline removal liquid is an aqueous solution including ammonia and hydrogen peroxide, for example. The alkaline removal liquid may be TMAH, for example. The acid removal liquid is an aqueous solution including diluted hydrofluoric acid, for example. The acid removal liquid may also be an aqueous solution including sulfuric acid and hydrogen peroxide, or an aqueous solution including acetic acid, for example. Further, an aqueous solution including a chelating agent may be used as the metal removal liquid. The chelating agent may include one type or a plurality of types selected from a group including an organic acid, an organic acid salt, an amino acid, an amino acid derivative, inorganic alkali, an inorganic alkali salt, an alkilamine, an alkilamine derivative, an alkanolamine and an alkanolamine derivative. The metal removal liquid can dissolve and remove a metallic component included in the metal containing coating liquid. The metal removal liquid guided to the flow path 711b is guided to the plurality of flow paths 733b through the flow path 731b and the flow path 732b, and is discharged from the plurality of discharge ports OP2 to the outer peripheral surface of the nozzle 622 stored in the nozzle storage hole 73a.

The collection container 72 has a storage 72a that communicates with the through hole 71a. Further, a flow path 72b is formed in the collection container 72, and a pipe 423 is connected to the flow path 72b. A cleaning liquid or a metal removal liquid in the storage 72a is guided to the pipe 423 through the flow path 72b. The pipe 423 branches into pipes 423a, 423b and extends to collection tanks TA1, TA2. A valve V4 is provided at the pipe 423a, and a valve V5 is provided at the pipe 423b. A collection unit 400 is constituted by the pipes 423, 423a, 423b, the collection tanks TA1, TA2 and the valves V4, V5. When the valves V4, V5 are selectively opened, the cleaning liquid and the metal removal liquid in the storage 72a are selectively guided to the collection tanks TA1, TA2. In the present example, the cleaning liquid is guided to the collection tank TA1, and the metal removal liquid is guided to the collection tank TA2. Further, a pipe 424 for guiding liquid or the like in the storage 72a to a discard line in a factory is connected to the collection storage 72. A valve V6 is provided at the pipe 424. The pipe 424 may be provided to branch from the pipe 423.

In each waiting pod WP, cleaning processing is performed on the nozzle 622 of the corresponding nozzle block 620 in a predetermined period. A period during which the cleaning processing is performed is a period during which the processing for the substrate W is suspended for a time period equal to or longer than a certain period of time in the coating processing unit 129, for example.

Figure 5A:
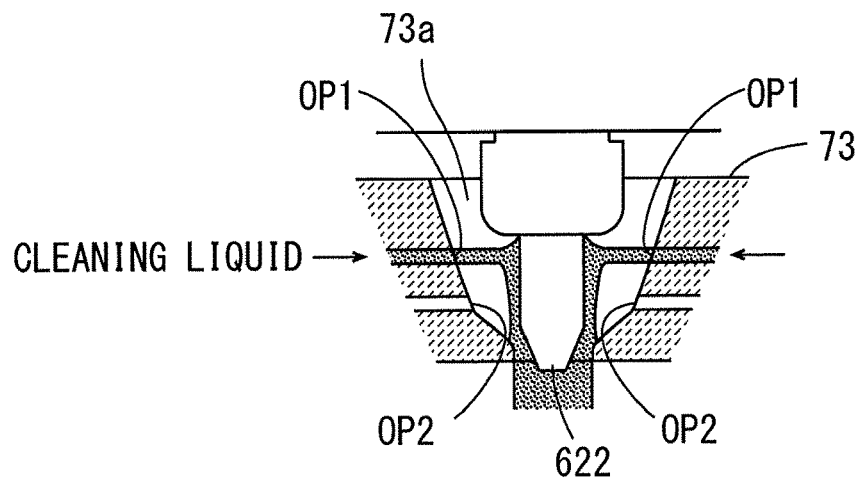
FIGS. 5A to 5C are diagrams for explaining a specific example of cleaning processing for a nozzle.
Figure 5B:
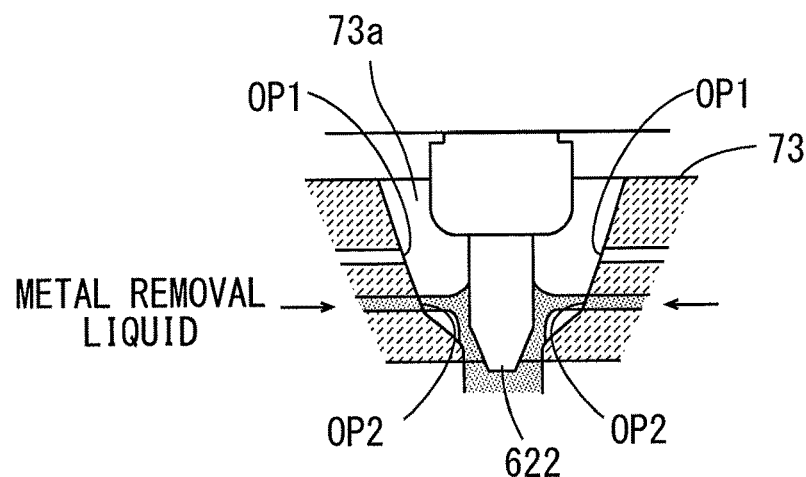
Figure 5C:
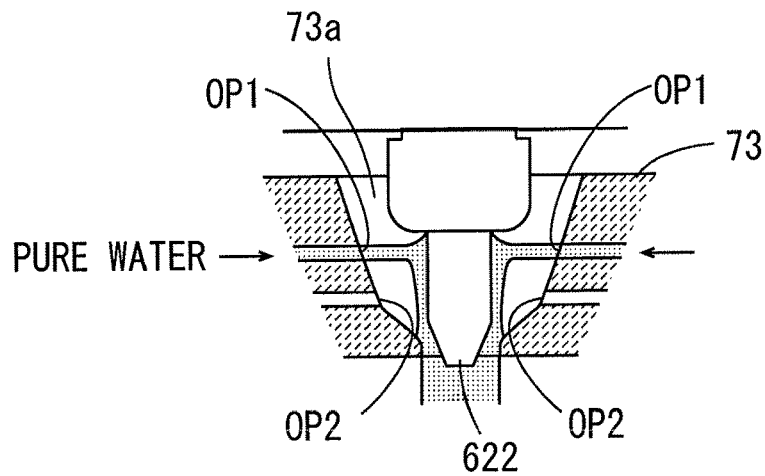

FIGS. 5A to 5C are diagrams for explaining a specific example of the cleaning processing for the nozzle 622. For example, the valves V1 to V6 of FIG. 4 are controlled by a local controller LC1 (FIG. 7), described below. First, the valve V1 of FIG. 4 is opened, and the valves V2, V3 are closed. Then, the valve V4 is opened, and the valves V5, V6 are closed.

Thus, as shown in FIG. 5A, the cleaning liquid is discharged from the plurality of discharge ports OP1 of the nozzle storage container 73 to the outer peripheral surface of the nozzle 622. In this case, the plurality of discharge ports OP1 are arranged to surround the outer peripheral surface of the nozzle 622, so that the cleaning liquid is supplied to the entire outer peripheral surface of the nozzle 622 in the circumferential direction. Thus, the coating liquid, its solidified matter and the like adhering to the nozzle 622 are dissolved and removed from the nozzle 622.

Further, the cleaning liquid that has been supplied to the nozzle 622 is guided to the collection tank TA1 of FIG. 4. In this case, in order to prevent contaminants such as the metal-containing coating liquid and the like that have been removed from the nozzle 622 from being guided to the collection tank TA1, the valve V4 may be closed and the valve V6 may be opened for a certain period of time from the time when the discharge of the cleaning liquid is started. Thus, contaminants such as the metal-containing coating liquid are discarded through the pipe 424 of FIG. 4.

Even when the cleaning liquid is supplied to the nozzle 622, the metallic component contained in the metal-containing coating liquid may not be sufficiently removed and may remain on the nozzle 622. As such, next, the valves V1, V2 of FIG. 4 are closed, and the valve V3 is opened. Further, the valve V5 is opened, and the valves V4, V6 are closed.

Thus, as shown in FIG. 5B, the metal removal liquid is discharged from the plurality of discharge ports OP2 of the nozzle storage container 73 to the outer peripheral surface of the nozzle 622. Also in this case, the plurality of discharge ports OP2 are arranged to surround the outer peripheral surface of the nozzle 622, so that the metal removal liquid is supplied to the entire outer peripheral surface of the nozzle 622 in the circumferential direction. Thus, the metallic component remaining on the nozzle 622 is dissolved and removed from the nozzle 622.

Further, the metal removal liquid that has been supplied to the nozzle 622 is guided to the collection tank TA2 of FIG. 4. In this case, in order to prevent the cleaning liquid remaining on the storage 72a, the metallic component that has been removed from the nozzle 622 and the like from being guided to the collection tank TA2, the valve V5 may be closed and the valve V6 may be opened for a certain period of time from the time when the discharge of the metal removal liquid is started. Thus, the cleaning liquid, the metallic component and the like in the storage 72a are discarded through the pipe 424 of FIG. 4.

Next, the valves V1, V3 of FIG. 4 are closed, the valve V2 is opened. Further, the valves V4, V5 are closed, and the valve V6 is opened. Thus, as shown in FIG. 5C, pure water is discharged from the plurality of discharge ports OP1 of the nozzle storage container 73 to the outer peripheral surface of the nozzle 622, and the metal removal liquid adhering to the nozzle 622 is cleaned away. Because the plurality of discharge ports OP1 are located at positions farther upward than the plurality of discharge ports OP2, the pure water that has been discharged from the discharge ports OP1 arrives at the positions higher than the positions at which the metal removal liquid that has been discharged from the discharge ports OP2 arrives, on the outer peripheral surface of the nozzle 622, and flows downwardly from the positions along the outer peripheral surface of the nozzle 622. Thus, the metal removal liquid is sufficiently cleaned away by the pure water, and the metal removal liquid is prevented from remaining on the nozzle 622. Therefore, the metal removal liquid is prevented from being mixed with the metal-containing coating liquid and being supplied to the substrate W.

Further, the discharged pure water and the metal removal liquid that has been cleaned away are discarded through the pipe 424 of FIG. 4. In this manner, the nozzle 622 is cleaned, and the cleaning processing for the nozzle 622 is completed.

When the cleaning liquid, the metal removal liquid or the pure water is supplied to the nozzle 622, the cleaning liquid, the metal removal liquid or the pure water may be sucked into the nozzle 622 with use of a suck-back valve or the like. In this case, the inside of the nozzle 622 can be cleaned by the cleaning liquid, the metal removal liquid or the pure water.

Each nozzle block 620 may perform pre-dispensing liquid in the corresponding waiting pod WP before discharging the coating liquid onto the substrate W. The nozzle 622 can be filled with a new coating liquid by pre-dispensing, and the new coating liquid can be discharged onto the substrate W. Further, when pre-dispensing is performed after the cleaning processing, the cleaning liquid, the metal removal liquid and the like remaining in the nozzle 622 are removed. Thus, the cleaning liquid, the metal removal liquid and the like are prevented from being discharged onto the substrate W.

While the cleaning liquid, the metal removal liquid and the pure water are sequentially supplied to the nozzle 622 in the example of FIGS. 5A to 5C, the present invention is not limited to this. The cleaning liquid may be supplied to the nozzle 622 instead of the pure water after the metal removal liquid is supplied to the nozzle 622. In this case, the metal removal liquid can be cleaned away by the cleaning liquid. Further, not the cleaning liquid but the metal removal liquid may be supplied to the nozzle 622 first, and the cleaning liquid may be subsequently supplied to the nozzle 622. In this case, the metallic component is removed from the nozzle 622 by the metal removal liquid. After that, the coating liquid, its solidified matter and the like are removed from the nozzle 622, and the metal removal liquid is cleaned away, by the cleaning liquid.

While only one type of a metal removal liquid is used for the cleaning processing for the nozzle 622 in the example of FIGS. 4, 5A, 5B and 5C, a plurality of types of metal removal liquids may be used. In this case, the plurality of types of metal removal liquids may be sequentially supplied to the nozzle 622, and any metal removal liquid may be selectively supplied to the nozzle 622.

Figure 6:
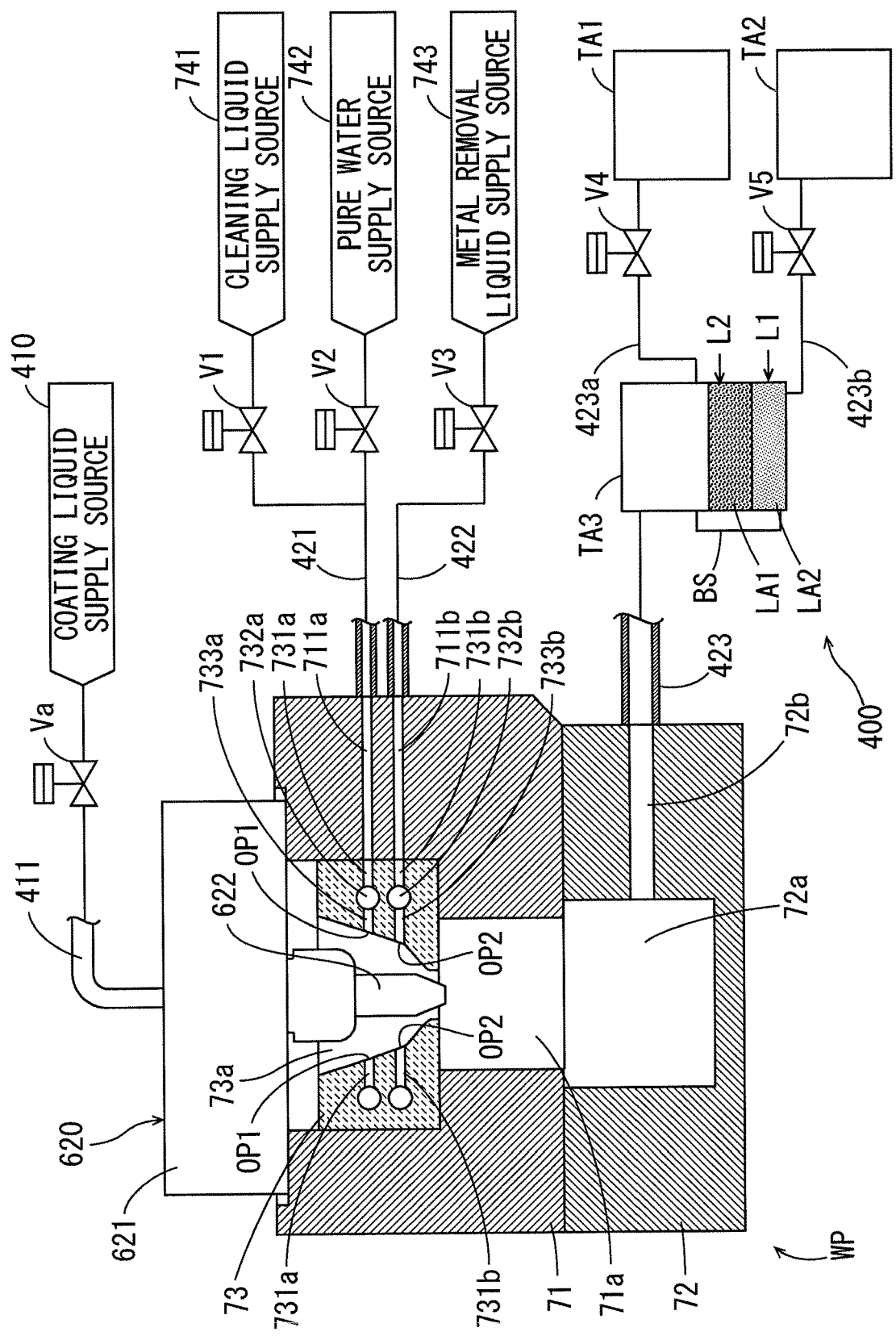
FIG. 6 is a diagram for explaining another example of a configuration of a collection unit.

FIG. 6 is a diagram for explaining another example of a configuration of a collection unit 400. As for the example of FIG. 6, differences from the example of FIG. 4 will be described. In the example of FIG. 6, a pipe 423 is connected to a separate tank TA3. Further, the separate tank TA3 is connected to collection tanks TA1, TA2 through pipes 423a, 423b. In this case, a cleaning liquid and a metal removal liquid are guided to the common separate tank TA3 from a storage 72a of a waiting pod WP.

Here, the cleaning liquid and the metal removal liquid have specific gravities that are different from each other, and the specific gravity of the metal removal liquid is larger than that of the cleaning liquid. Therefore, in the separate tank TA3, a layer LA1 of the cleaning liquid and a layer LA2 of the metal removal liquid are formed to be separated from each other in the vertical direction. As such, a boundary detector BS that detects a boundary surface between the layer LA1 and the layer LA2 is provided in the separate tank TA3. As the boundary detector BS, a capacitance type liquid surface level sensor is used, for example. A liquid surface level sensor of another type such as a float type, an optical type, an ultrasonic type, an electrical conductivity type or a piezo resonance type may be used as the boundary detector BS instead.

A lower limit height L1 and an upper limit height L2 of the boundary surface between the layer LA1 and the layer LA2 are set in the separate tank TA3. The upper limit height L2 is located above the lower limit height L1. In the separate tank TA3, a pipe 423a is attached to a position higher than the upper limit height L2, and a pipe 423b is attached to a position lower than the lower limit height L1.

For example, when the height of the boundary surface detected by the boundary detector BS is lower than the lower limit height L1, the valve V5 is closed. Thus, the cleaning liquid is prevented from being guided to the collection tank TA2 through the pipe 423b. In this case, the valve V4 may be opened or closed. When the height of the boundary surface detected by the boundary detector BS is equal to or higher than the lower limit height L1, and lower than the upper limit height L2, the valves V4, V5 are opened. Thus, the cleaning liquid and the metal removal liquid are guided to the collection tanks TA1, TA2 through the pipes 423a, 423b, respectively. When the height of the boundary surface detected by the boundary detector BS is equal to or higher than the upper limit height L2, the valve V5 is opened, and the valve V4 is closed. Thus, the metal removal liquid is guided to the collection tank TA2 through the pipe 423b. Further, the metal removal liquid is prevented from being guided to the collection tank TA1 through the pipe 423a.

In this manner, in the example of FIG. 6, the used cleaning liquid and the used metal removal liquid are separated from each other based on the specific gravities of the cleaning liquid and the metal removal liquid. Thus, the cleaning liquid and the metal removal liquid can be collected separately. In this case, it is not necessary for a user to perform an operation of separating the cleaning liquid and the metal removal liquid. Thus, the cost for collecting and discarding each liquid can be lowered.

(2-2) Development Processing Units and Cleaning Drying Processing Units

As shown in FIG. 2, similarly to the coating processing units 129, each development processing unit 139 includes a plurality of spin chucks 35 and a plurality of cups 37. Further, as shown in FIG. 1, the development processing unit 139 includes two slit nozzles 38 that discharge the development liquid and a movement mechanism 39 that moves these slit nozzles 38 in the X direction.

In the development processing unit 139, the spin chuck 35 is rotated by a driving device (not shown). Thus, the substrate W is rotated. In this state, the development liquid is supplied to each substrate W while the slit nozzle 38 moves. Thus, the development processing is performed on the substrate W.

A plurality (three in the present example) of cleaning drying processing units BSS are provided in the cleaning drying processing section 161. In each cleaning drying processing unit BSS, the peripheral portion and the back surface of the substrate W, which has not been exposed, are cleaned with use of an organic solvent or pure water and dried. Here, the back surface refers to a surface on the opposite side of the surface to be processed of the substrate W.

(3) Thermal Processing Sections

Figure 7:
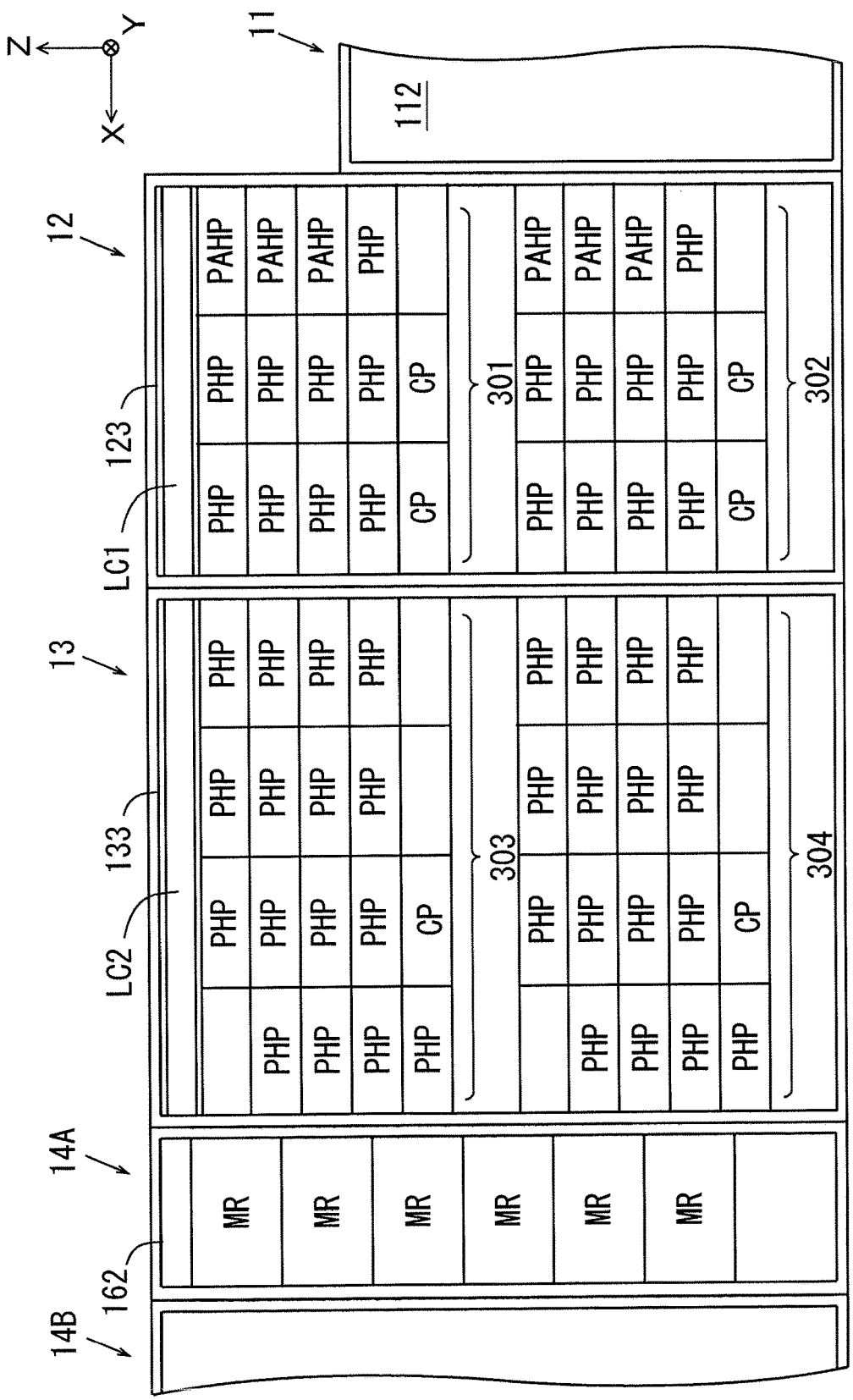
FIG. 7 is a schematic side view showing inner configurations of thermal processing sections and a cleaning drying processing section of FIG. 1.

FIG. 7 is a schematic side view showing inner configurations of the thermal processing sections 123, 133 and the cleaning drying processing section 162 of FIG. 1. As shown in FIG. 7, the thermal processing section 123 has an upper thermal processing section 301 provided above and a lower thermal processing section 302 provided below. A plurality of thermal processing units PHP, a plurality of adhesion reinforcement processing units PAHP and a plurality of cooling units CP are provided in each of the upper thermal processing section 301 and the lower thermal processing section 302.

A local controller LC1 is provided in a top portion of the thermal processing section 123. The local controller LC1 controls operations of the coating processing section 121 (FIG. 1), the transport section 122 (FIG. 1) and the thermal processing section 123 based on instructions from the main controller 114 of FIG. 1.

Heating processing and cooling processing are performed on the substrate W in each thermal processing unit PHP. Adhesion reinforcement processing for improving adhesion between the substrate W and the anti-reflection film is performed in each adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, cooling processing is performed on the substrate W.

The thermal processing section 133 has an upper thermal processing section 303 provided above and a lower thermal processing section 304 provided below. A cooling unit CP and a plurality of thermal processing units PHP are provided in each of the upper thermal processing section 303 and the lower thermal processing section 304.

A local controller LC2 is provided in a top portion of the thermal processing section 133. The local controller LC2 controls operations of the development processing section 131 (FIG. 1), the transport section 132 (FIG. 1) and the thermal processing section 133 based on instructions from the main controller 114 of FIG. 1.

(4) Metal Removal Units

As described above, with the substrate W rotated by the spin chuck 611 of FIG. 3, the film removal liquid is discharged to the peripheral portion of the substrate W from the edge rinse nozzle 613, whereby the coating liquid that has been applied to the peripheral portion of the substrate W is dissolved. Thus, the metal-containing coating film at the peripheral portion of the substrate W is removed. However, the metallic component contained in the metal-containing coating liquid may remain on the peripheral portion of the substrate W. Further, when the metal-containing coating liquid flows to the back surface of the substrate W, the metallic component contained in the metal-containing coating liquid remains on the back surface of the substrate W.

When the substrate W is transported in the substrate processing apparatus 100 with the metallic component adhering to the peripheral portion or the back surface of the substrate W, the inside of the substrate processing apparatus 100 and the inside of the exposure device 15 are contaminated by the metallic component. As such, the cleaning drying processing section 162 is provided with a plurality (six in the present example) of metal removal units MR for removing the metallic component adhering to the peripheral portion and the back surface of the substrate W that has not been exposed.

In the present example, a metal removal liquid used in three metal removal units MR is different from a metal removal liquid used in the remaining three metal removal units MR. In this case, according to a type of the metallic component contained in the metal-containing coating liquid, the metallic component adhering to the peripheral portion and the back surface of the substrate W can be removed by a suitable metal removal unit MR.

Figure 8:
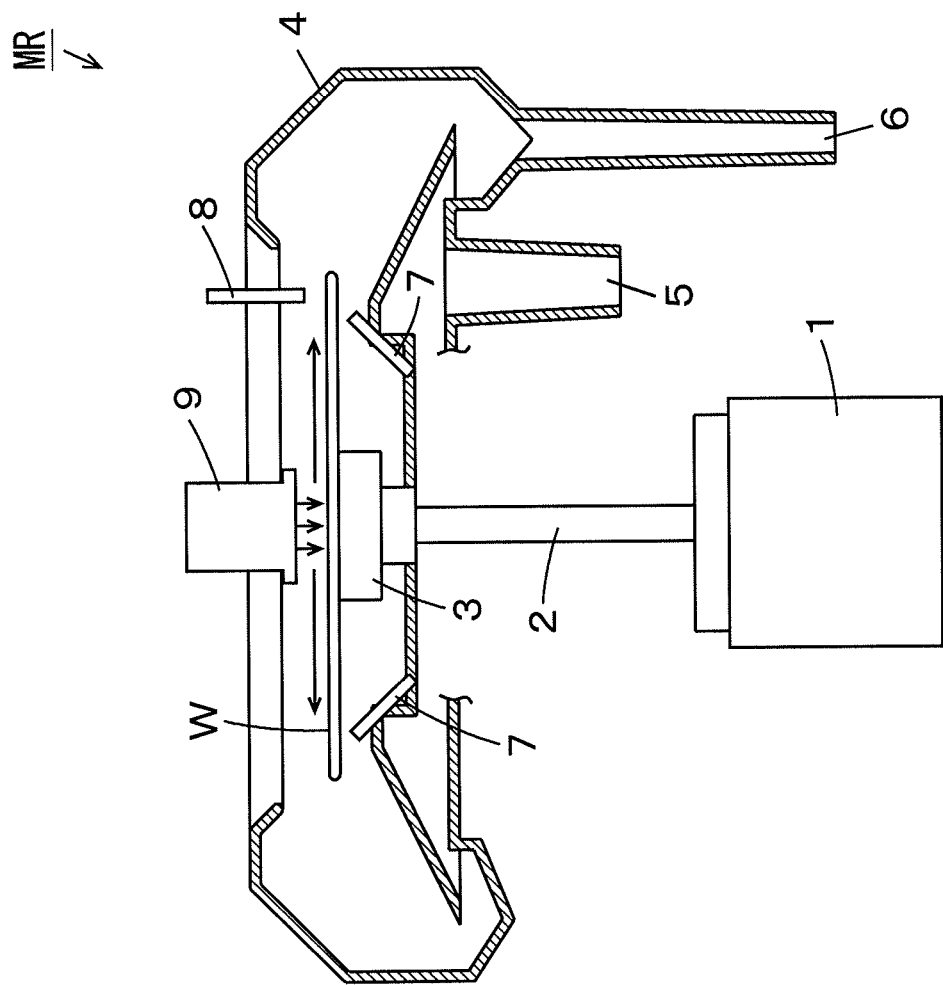
FIG. 8 is a diagram showing a first example of a configuration of a metal removal unit.

FIG. 8 is a diagram showing a first example of a configuration of the metal removal unit MR. As shown in FIG. 8, a motor 1, a spin chuck 3, a cup 4, two back surface cleaning nozzles 7, a peripheral portion cleaning nozzle 8 and a gas supplier 9 are provided in the metal removal unit MR. The spin chuck 3 is attached to an upper end of a rotation shaft 2 of the motor 1 to be rotatable about a vertical axis. The cup 4 is arranged to surround the substrate W held by the spin chuck 3. A gas exhaust port 5 and a liquid drainage port 6 are formed in lower portions of the cup 4.

The two back surface cleaning nozzles 7 are arranged to be directed to the back surface of the substrate W held by the spin chuck 3. The metal removal liquid is discharged to the back surface of the substrate W from the back surface cleaning nozzles 7. The peripheral portion cleaning nozzle 8 is arranged to be directed to the peripheral portion of the substrate W held by the spin chuck 3. The metal removal liquid is discharged to the peripheral portion of the substrate W from the peripheral portion cleaning nozzle 8.

The gas supplier 9 is arranged above a substantially center portion of the substrate W held by the spin chuck 3. An inert gas, for example, a nitrogen gas, is ejected to the substantially center portion of the surface to be processed of the substrate W from the gas supplier 9. In this case, the gas ejected from the gas supplier 9 is diffused around the substantially center portion of the surface to be processed of the substrate W. Thus, the metal removal liquid discharged from the peripheral portion cleaning nozzle 8 is prevented from adhering to the coating film formed on the surface to be processed of the substrate W.

Figure 9:
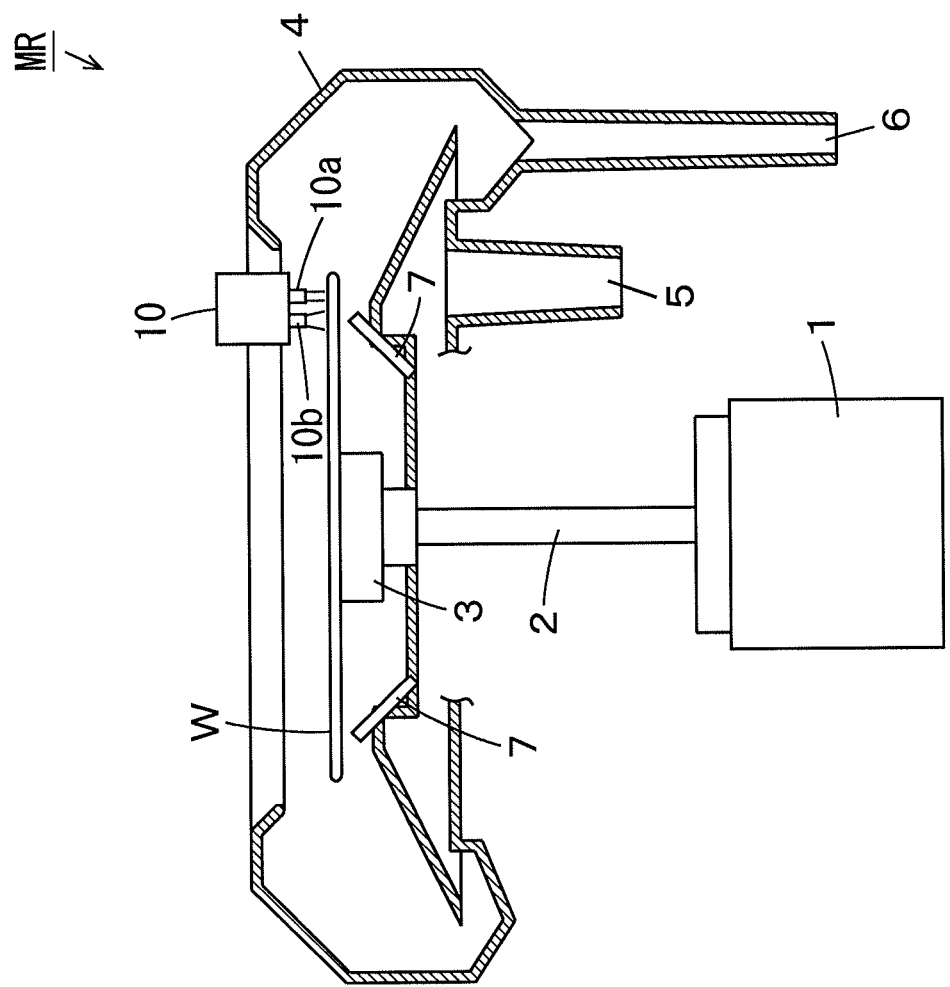
FIG. 9 is a diagram showing a second example of the configuration of the metal removal unit.

FIG. 9 is a diagram showing a second example of the configuration of the metal removal unit MR. As shown in FIG. 9, in the metal removal unit MR in the second example of the configuration, a gas liquid supply nozzle 10 is provided instead of the peripheral portion cleaning nozzle 8 and the gas supplier 9 of FIG. 8. The gas liquid supply nozzle 10 includes a liquid nozzle 10a and a gas nozzle 10b that are arranged in a horizontal direction. The gas liquid supply nozzle 10 is arranged to be directed to the peripheral portion of the substrate W held by the spin chuck 3. Here, the gas nozzle 10b is arranged at a position closer to the center of the substrate W than the liquid nozzle 10a.

The metal removal liquid is discharged to the peripheral portion of the substrate W from the liquid nozzle 10a. An inert gas, for example, a nitrogen gas, is ejected to the peripheral portion of the substrate W from the gas nozzle 10b. In this case, a position of the substrate W to which the gas is ejected from the gas nozzle 10b is closer to the center of the substrate W than the position to which the metal removal liquid is discharged from the liquid nozzle 10a. Therefore, the metal removal liquid discharged from the liquid nozzle 10a is prevented from moving towards the center of the substrate W by the gas ejected from the gas nozzle 10b. Thus, the metal removal liquid discharged from the liquid nozzle 10a is prevented from adhering to the coating film formed on the surface to be processed of the substrate W.

In the metal removal unit MR of FIGS. 8 and 9, because the metal removal liquid is supplied to the peripheral portion of the substrate W from the peripheral portion cleaning nozzle 8 or the liquid nozzle 10a, the metallic component in the metal-containing coating film at the peripheral portion of the substrate W is dissolved, and the metal-containing coating film remains in a region except for the peripheral portion of the surface to be processed of the substrate W. Further, because the metal removal liquid is supplied to the back surface of the substrate W from the back surface cleaning nozzle 7, even when the metal-containing coating liquid flows to the back surface of the substrate W, the metallic component in the metal-containing coating liquid adhering to the back surface of the substrate is removed.

Further, in the present example, because the substrate W of which the metal-containing coating film has been cured by the thermal processing section 123 is transported to the metal removal unit MR, even when the gas is discharged to the substrate W from the gas supplier 9 or the gas nozzle 10b in the metal removal unit MR, the film thickness of the metal-containing coating film is not affected by the gas. As a result, the metal-containing coating film having a uniform thickness can be formed on the surface to be processed of the substrate W.

(5) Transport Sections

Figure 10:
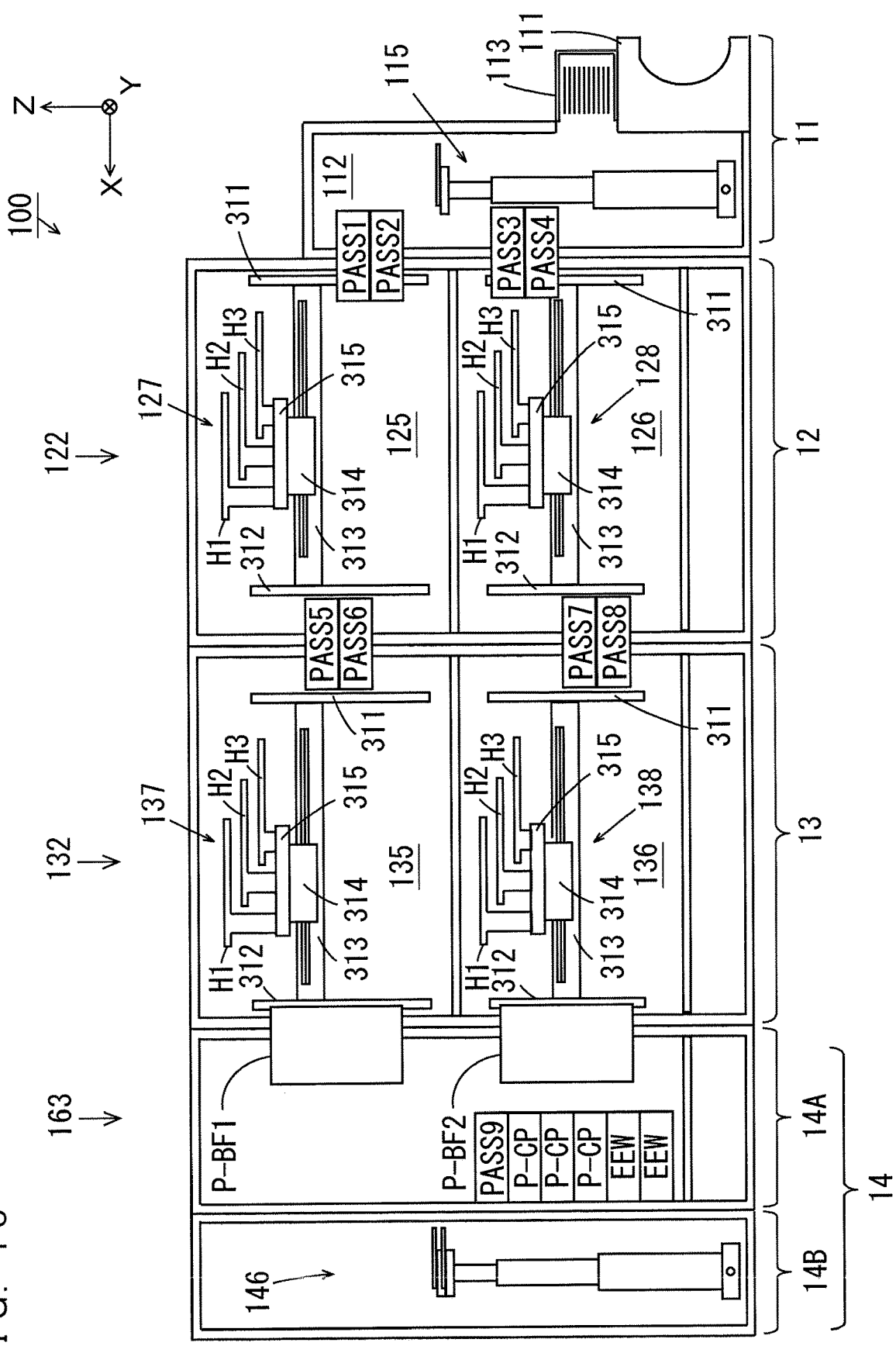
FIG. 10 is a schematic side view showing an inner configuration of transport sections.

FIG. 10 is a schematic side view showing inner configurations of the transport sections 122, 132, 163. As shown in FIG. 10, the transport section 122 has an upper transport chamber 125 and a lower transport chamber 126. The transport section 132 has an upper transport chamber 135 and a lower transport chamber 136. The upper transport chamber 125 is provided with a transport mechanism 127, and the lower transport chamber 126 is provided with a transport mechanism 128. Further, the upper transport chamber 135 is provided with a transport mechanism 137, and the lower transport chamber 136 is provided with a transport mechanism 138.

The upper thermal processing section 301 (FIG. 7) is opposite to the coating processing chambers 21, 22 (FIG. 2) with the upper transport chamber 125 interposed therebetween. The lower thermal processing section 302 (FIG. 7) is opposite to the coating processing chambers 23, 24 (FIG. 2) with the lower transport chamber 126 interposed therebetween. Similarly, the upper thermal processing section 303 (FIG. 7) is opposite to the development processing chambers 31, 32 (FIG. 2) with the upper transport chamber 135 interposed therebetween. The lower thermal processing section 304 (FIG. 7) is opposite to the development processing chambers 33, 34 (FIG. 2) with the lower transport chamber 136 interposed therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9, the plurality of edge exposure units EEW and the plurality of placement cooling units P-CP are provided in the transport section 163 to be adjacent to the carry-in carry-out block 14B.

The placement buffer unit P-BF1 is configured to be capable of carrying in and carrying out the substrate W by the transport mechanism 137 and the transport mechanisms 141, 142 (FIG. 1). The placement buffer unit P-BF2 is configured to be capable of carrying in and carrying out the substrate W by the transport mechanism 138 and the transport mechanisms 141, 142 (FIG. 1). Further, the substrate platform PASS9, the edge exposure units EEW and the placement cooling units P-CP are configured to be capable of carrying in and carrying out the substrates W by the transport mechanisms 141, 142 (FIG. 1) and the transport mechanism 146.

In each edge exposure unit EEW, exposure processing (edge exposure processing) is performed on the peripheral portion of the substrate W. The edge exposure processing is performed on the substrate W, so that a resist film on the peripheral portion of the substrate W is removed during the subsequent development processing. Thus, when the peripheral portion of the substrate W comes into contact with another member after the development processing, the resist film on the peripheral portion of the substrate W is prevented from being stripped and becoming particles.

The substrates W to be transported from the indexer block 11 to the first processing block 12 are placed on the substrate platform PASS1 and the substrate platform PASS3. The substrates W to be transported from the first processing block 12 to the indexer block 11 are placed on the substrate platform PASS2 and the substrate platform PASS4.

The substrates W to be transported from the first processing block 12 to the second processing block 13 are placed on the substrate platform PASS5 and the substrate platform PASS7. The substrates W to be transported from the second processing block 13 to the first processing block 12 are placed on the substrate platform PASS6 and the substrate platform PASS8.

The substrates W to be transported from the second processing block 13 to the cleaning drying processing block 14A are placed on the placement buffer units P-BF1, P-BF2. The substrates W to be transported from the cleaning drying processing block 14A to the carry-in carry-out block 14B are placed on the placement cooling units P-CP. The substrates W to be transported from the carry-in carry-out block 14B to the cleaning drying processing block 14A are placed on the substrate platform PASS9.

Figure 11:
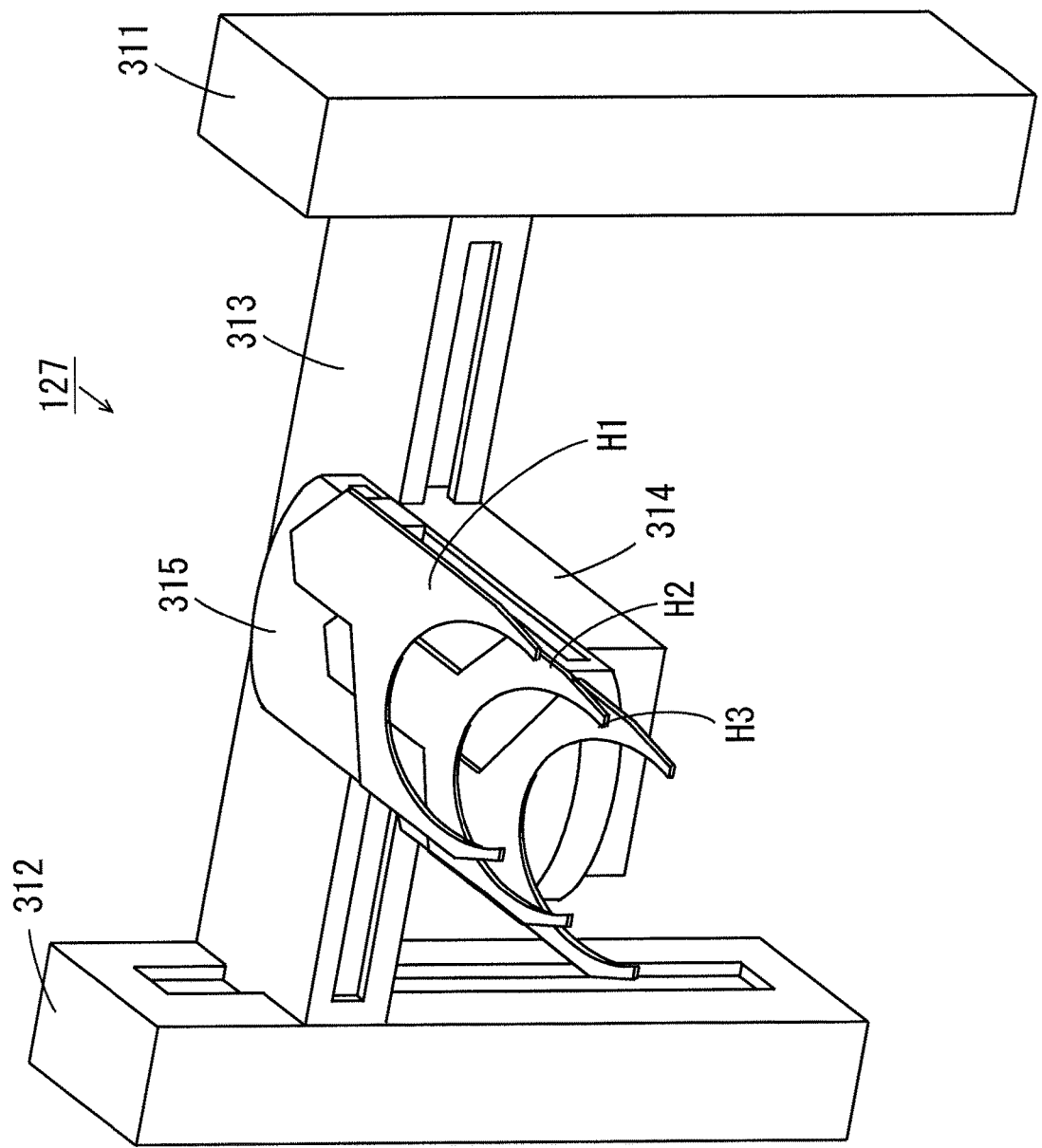
FIG. 11 is a perspective view showing a transport mechanism.

Next, the transport mechanism 127 will be described. FIG. 11 is a perspective view showing the transport mechanism 127. As shown in FIGS. 10 and 11, the transport mechanism 127 includes elongated guide rails 311, 312. As shown in FIG. 10, the guide rail 311 is fixed to the side surface close to the transport section 112 to extend in the vertical direction in the upper transport chamber 125. The guide rail 312 is fixed to the side surface close to the upper transport chamber 135 to extend in the vertical direction in the upper transport chamber 125.

An elongated guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in a longitudinal direction of the guide rail 313.

An elongated rotation member 315 is rotatably provided on an upper surface of the moving member 314. Hands H1, H2, H3 for holding outer peripheries of the substrates W are attached to the rotation member 315. The hands H1 to H3 are provided to be movable in a longitudinal direction of the rotation member 315. The hand H1 is arranged at a position farther upward than the hand H2, and the hand H2 is arranged at a position farther upward than the hand H3.

The above-mentioned configuration enables the transport mechanism 127 to move in the X and Z directions in the upper transport chamber 125. The transport mechanism 127 can receive the substrates W from and transfer the substrates W to the coating processing chambers 21, 22 (FIG. 2), the substrate platforms PASS1, PASS2, PASS5, PASS6 (FIG. 10) and the upper thermal processing section 301 (FIG. 7) using the hands H1 to H3.

As shown in FIG. 10, the transport mechanisms 128, 137, 138 have the configuration similar to that of the transport mechanism 127. Further, in the present embodiment, the transport mechanism 142 of FIG. 1 has the three hands H1 to H3 similar to those of the transport mechanism 127.

(6) Substrate Processing

The substrate processing will be described with reference to FIGS. 1, 2, 7 and 10. Each carrier 113 in which unprocessed substrates W are stored is placed on each carrier platform 111 (FIG. 1) in the indexer block 11. The transport mechanism 115 transports the unprocessed substrate W from the carrier 113 to each of the substrate platforms PASS1, PASS3 (FIG. 10). Further, the transport mechanism 115 transports the processed substrate W that is placed on each of the substrate platforms PASS2, PASS4 (FIG. 10) to the carrier 113.

In the first processing block 12, the transport mechanism 127 (FIG. 10) sequentially transports the unprocessed substrate W that is placed on the substrate platform PASS1 to the adhesion reinforcement processing unit PAHP (FIG. 7), the cooling unit CP (FIG. 7) and the coating processing chamber 22 (FIG. 2) using the middle hand H2 and the lower hand H3. Next, the transport mechanism 127 sequentially transports the substrate W in the coating processing chamber 22 to the thermal processing unit PHP (FIG. 7), the cooling unit CP (FIG. 7), the coating processing chamber 21 (FIG. 2), the thermal processing unit PHP (FIG. 7) and the substrate platform PASS5 (FIG. 10) using the hands H2, H3.

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, an anti-reflection film is formed on the substrate W by the coating processing unit 129 (FIG. 2) in the coating processing chamber 22. Subsequently, the thermal processing is performed on the substrate W in the thermal processing unit PHP, and then the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing is performed on the substrate W in the thermal processing unit PHP, and the substrate W is placed on the substrate platform PASS5.

Further, the transport mechanism 127 transports the substrate W on which the development processing has been performed and which is placed on the substrate platform PASS6 (FIG. 10) to the substrate platform PASS2 (FIG. 10) using the upper hand H1.

The transport mechanism 128 (FIG. 10) sequentially transports the unprocessed substrate W that is placed on the substrate platform PASS3 to the adhesion reinforcement processing unit PAHP (FIG. 7), the cooling unit CP (FIG. 7), and the coating processing chamber 24 (FIG. 2) using the middle hand H2 and the lower hand H3. Next, the transport mechanism 128 sequentially transports the substrate W in the coating processing chamber 24 to the thermal processing unit PHP (FIG. 7), the cooling unit CP (FIG. 7), the coating processing chamber 23 (FIG. 2), the thermal processing unit PHP (FIG. 7) and the substrate platform PASS7 (FIG. 10) using the hands H2, H3.

Further, the transport mechanism 128 (FIG. 10) transports the substrate W on which the development processing has been performed and which is placed on the substrate platform PASS8 (FIG. 10) to the substrate platform PASS4 (FIG. 10) using the upper hand H1. The contents of processing for the substrate W in the coating processing chambers 23, 24 (FIG. 2) and the lower thermal processing section 302 (FIG. 7) are respectively similar to the contents of processing for the substrate W in the above-mentioned coating processing chambers 21, 22 (FIG. 2) and the upper thermal processing section 301 (FIG. 7).

In the second processing block 13, the transport mechanism 137 (FIG. 10) transports the substrate W on which the resist film is formed and which is placed on the substrate platform PASS5 to the placement buffer unit P-BF1 (FIG. 10) using the lower hand H3.

Further, the transport mechanism 137 (FIG. 10) takes out the substrate W that has been exposed and thermally processed from the thermal processing unit PHP (FIG. 7) adjacent to the cleaning drying processing block 14A using the upper hand H1 and the middle hand H2. The transport mechanism 137 sequentially transports the substrate W to the cooling unit CP (FIG. 7), one of the development processing chambers 31, 32 (FIG. 2), the thermal processing unit PHP (FIG. 7) and the substrate platform PASS6 (FIG. 10) using the hands H1, H2.

In this case, the substrate W is cooled in the cooling unit CP to a temperature suitable for the development processing, and then the development processing is performed on the substrate W by the development processing unit 139 in one of the development processing chambers 31, 32. Thereafter, the thermal processing is performed on the substrate W in the thermal processing unit PHP, and the substrate W is placed on the substrate platform PASS6.

The transport mechanism 138 (FIG. 10) transports the substrate W on which the resist film is formed and which is placed on the substrate platform PASS7 to the placement buffer unit P-BF2 (FIG. 10) using the lower hand H3.

Further, the transport mechanism 138 (FIG. 10) takes out the substrate W which has been exposed and thermally processed from the thermal processing unit PHP (FIG. 7) adjacent to the interface block 14 using the upper hand H1 and the middle hand H2. The transport mechanism 138 sequentially transports the substrate W to the cooling unit CP (FIG. 7), one of the development processing chambers 33, 34 (FIG. 2), the thermal processing unit PHP (FIG. 7) and the substrate platform PASS8 (FIG. 10) using the hands H1, H2. The contents of processing for the substrate W in the development processing chambers 33, 34 and the lower thermal processing section 304 are respectively similar to the contents of processing for the substrate W in the above-mentioned development processing chambers 31, 32 and the upper thermal processing section 303.

In the cleaning drying processing block 14A, the transport mechanism 142 (FIG. 1) transports the substrate W that is placed on the placement buffer unit P-BF1, P-BF2 (FIG. 10) to the metal removal unit MR (FIG. 7) using the lower hand H3. Further, the transport mechanism 142 transports the substrate W in the metal removal unit MR to the placement buffer unit P-BF1 (FIG. 10) or the placement buffer unit P-BF2 (FIG. 10) using the upper hand H1 and the middle hand H2. The transport mechanism 141 (FIG. 1) sequentially transports the substrate W that has been transported from the metal removal unit MR to the placement buffer unit P-BF1, P-BF2 to the cleaning drying processing unit BSS (FIG. 2), the edge exposure unit EEW and the placement cooling unit P-CP (FIG. 10).

In this case, in the metal removal unit MR, the metallic component remaining on the peripheral portion and the back surface of the substrate W is removed. Further, in the cleaning drying processing unit BSS, the peripheral portion and the back surface of the substrate W are cleaned and dried. Subsequently, the edge exposure processing is performed on the substrate W in the edge exposure unit EEW. After that, the substrate W is cooled in the placement cooling unit P-CP to a temperature suitable for the exposure processing by the exposure device 15 (FIG. 1).

Further, the transport mechanism 142 (FIG. 1) transports the substrate W, which is placed on the substrate platform PASS9 (FIG. 10) and has been exposed, to a thermal processing unit PHP (FIG. 7) in the upper thermal processing section 303 or the lower thermal processing section 304. In this case, post-exposure bake (PEB) processing is performed in the thermal processing unit PHP.

In the carry-in carry-out block 14B, the transport mechanism 146 (FIG. 1) transports the substrate W, which is placed on the placement cooling unit P-CP (FIG. 10) and has not been exposed, to a substrate inlet of the exposure device 15 (FIG. 1). Further, the transport mechanism 146 takes out the substrate W, which has been exposed, from a substrate outlet of the exposure device 15, and transports the substrate W to the substrate platform PASS9 (FIG. 10). In the exposure device 15, the exposure processing is performed on the substrate W by EUV having a significantly short wavelength. In this case, the metallic component is contained in the coating film on the substrate W, so that EUV light is efficiently absorbed. Thus, a fine exposure pattern can be formed at high resolution. The exposure method is not limited to this, and the exposure processing may be performed on the substrate W with use of another method.

In the above-mentioned transportation of the substrate W, the substrate W from which the metallic component has not been removed and the substrate W from which the metallic component has been removed are held by different hands of the transport mechanisms 127, 128, 137, 138, 142. Thus, the metallic component is prevented from adhering to the substrate W, from which the metallic component has been removed, via the hands of the transport mechanisms 127, 128, 137, 138, 142. Thus, metal contamination via the transport mechanisms is prevented from spreading.

(7) Effects

In the substrate processing apparatus 100 according to the present embodiment, the cleaning liquid and the metal removal liquid are supplied to the nozzle 622 of the coating processing unit 129, so that the cleaning processing is performed on the nozzle 622. Thus, the coating liquid and its solidified matter adhering to the nozzle 622 are removed, and the metallic component remaining on the nozzle 622 is removed. Therefore, the metallic component is prevented from being diffused from the nozzle 622. As a result, the substrate W, the inside of the substrate processing apparatus 100 and the inside of the exposure device 15 are prevented from being contaminated by metal.

(8) Another Example of Waiting Pods WP

Figure 12:
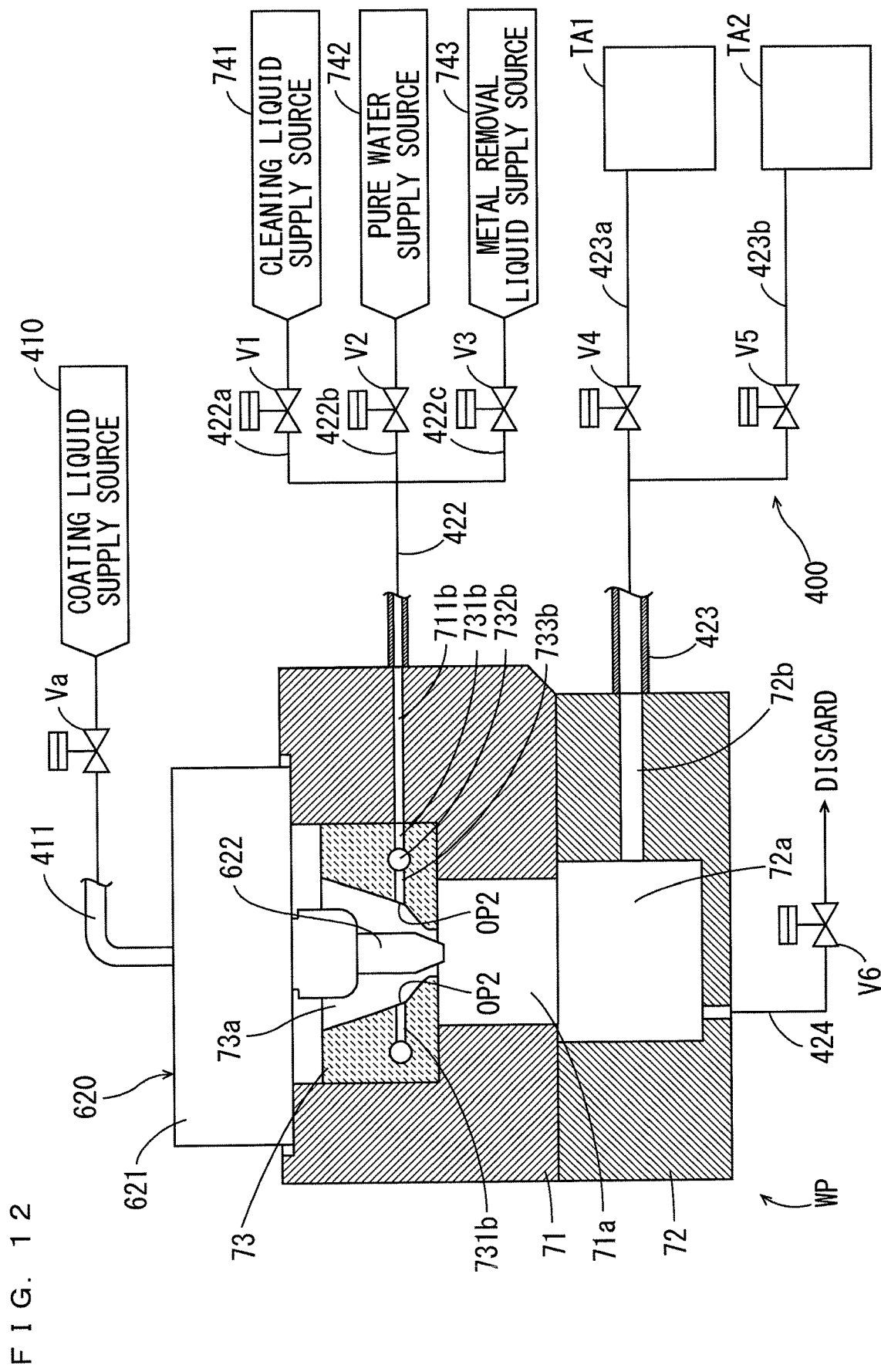
FIG. 12 is a diagram for explaining another example of a waiting pod.

FIG. 12 is a diagram for explaining another example of a waiting pod WP. As for the waiting pod WP of FIG. 12, differences from the example of FIG. 4 will be described.

In the waiting pod WP of FIG. 12, the flow path 711a of the liquid supply container 71 and the flow paths 731a, 732a, 733a of the nozzle storing container 73 are not formed. Further, a pipe 422 branches into pipes 422a, 422b, 422c, and these pipes 422a, 422b, 422c are connected to a cleaning liquid supply source 741, a pure water supply source 742 and a metal removal liquid supply source 743, respectively. Valves V1, V2, V3 are provided at the pipes 422a, 422b, 422c, respectively. Valves V1, V2, V3 are opened selectively, so that the cleaning liquid, the pure water and the metal removal liquid, described above, are selectively guided to a flow path 711b from the cleaning liquid supply source 741, the pure water supply source 742 and the metal removal liquid supply source 743. Thus, the cleaning liquid, the pure water and the metal removal liquid are respectively discharged to a nozzle 622 from a plurality of common discharge ports OP2.

Also in the present example, the cleaning liquid is discharged to the nozzle 622, so that the coating liquid, its solidified matter and the like adhering to the nozzle 622 are removed. Further, the metal removal liquid is discharged to the nozzle 622, so that a metallic component remaining on the nozzle 622 is removed. Further, the pure water is discharged to the nozzle 622, so that the metal removal liquid adhering to the nozzle 622 is cleaned away. Thus, the nozzle 622 can be cleaned. Further, as compared to the example of FIG. 4, configuration of the waiting pod WP is simplified.

During the cleaning processing for the nozzle 622, the nozzle 622 may be lifted and lowered by the nozzle transport mechanism 60 of FIG. 3. For example, in a period during which the cleaning liquid and the pure water are discharged, the nozzle 622 may be maintained at a first height. Further, in a period during which the metal removal liquid is discharged, the nozzle 622 may be maintained at a second height that is higher than the first height. In this case, similarly to the example of FIGS. 5A to 5C, a region to which the pure water is supplied is larger than a region to which the metal removal liquid is supplied, on the outer peripheral surface of the nozzle 622. Thus, the metal removal liquid is sufficiently cleaned away by the pure water, and the metal removal liquid is prevented from remaining on the nozzle 622.

Further, as described above, the metal removal liquid may be supplied to the nozzle 622, and then the cleaning liquid may be supplied to the nozzle 622 instead of the pure water. Further, the metal removal liquid may be supplied to the nozzle 622 first, and then the cleaning liquid may be supplied to the nozzle 622. Further, a plurality of types of metal removal liquids may be used. While the collection unit 400 of FIG. 4 is used in the example of FIG. 12, the collection unit 400 of FIG. 6 may be used instead.

Alternatively, the metal removal liquid having a property of dissolving the coating liquid may be supplied to the flow path 711b. In this case, the metal removal liquid is supplied to the nozzle 622, so that the coating liquid and its solidified matter are removed from the nozzle 622, and the metallic component is removed simultaneously. Thus, the nozzle 622 can be cleaned efficiently with a simple configuration.

(9) Another Example of Spin Units

Figure 13:
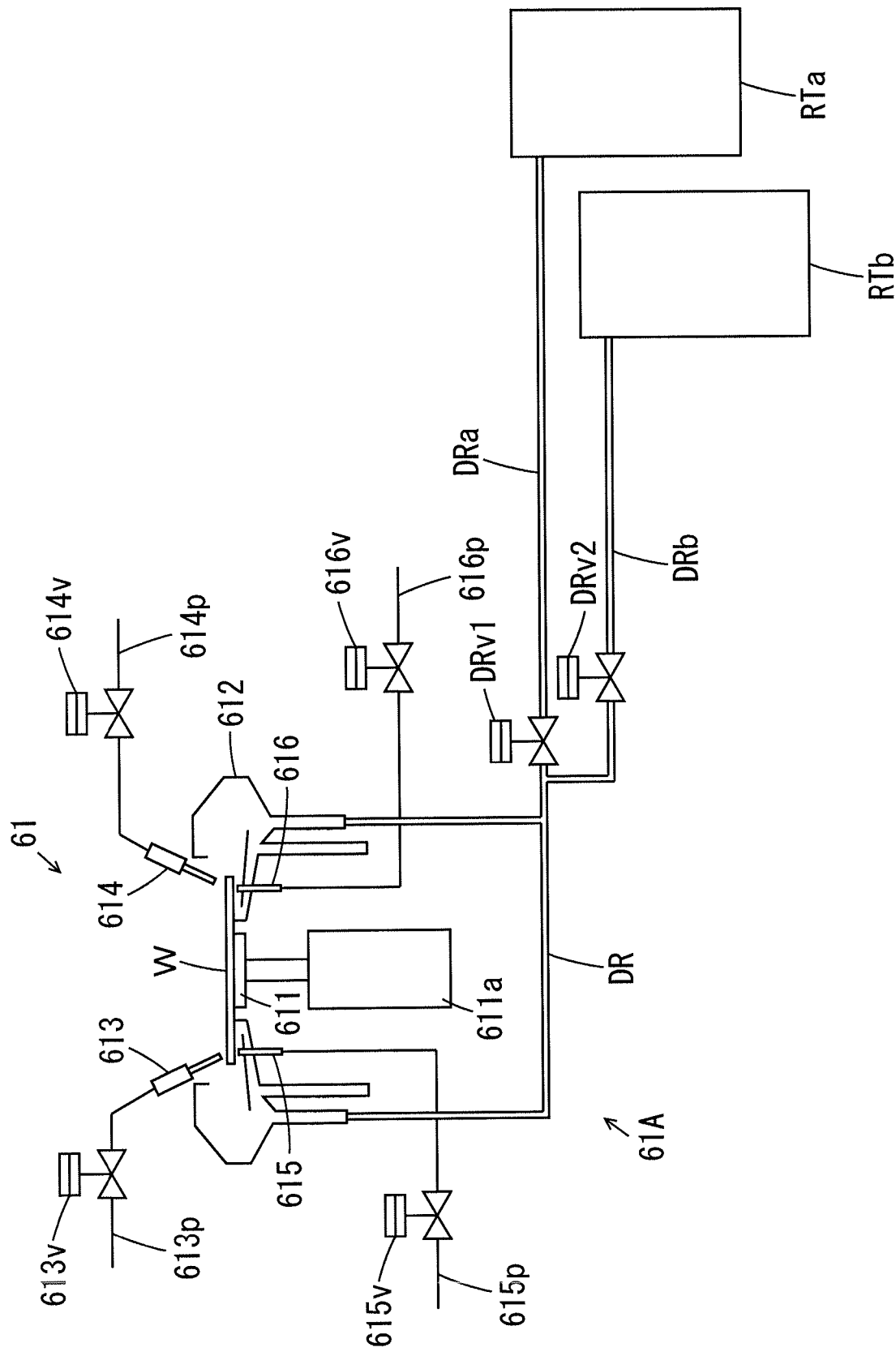
FIG. 13 is a schematic side view for explaining another example of a spin unit.

FIG. 13 is a schematic side view for explaining another example of a spin unit 61. As for the spin unit 61 of FIG. 13, differences from the spin unit 61 of FIG. 3 will be described.

In addition to the configuration of FIG. 3, the spin unit 61 of FIG. 13 further includes an edge rinse nozzle 614 and back rinse nozzles 615, 616. Similarly to the edge rinse nozzle 613, the edge rinse nozzle 614 is arranged to be directed to the peripheral portion of the surface to be processed of the substrate W held by the spin chuck 611. The back rinse nozzles 615, 616 are arranged to be directed to the back surface of the substrate W held by a spin chuck 611. The spin chuck 611 is provided on the upper end of the rotation shaft of the motor 611a.

Supply pipes 613p, 614p are connected to the edge rinse nozzles 613, 614, respectively. Supply valves 613v, 614v are provided at the supply pipes 613p, 614p, respectively. Supply pipes 615p, 616p are connected to the back rinse nozzles 615, 616, respectively. Supply valves 615v, 616v are provided at the supply pipes 615p, 616p, respectively.

A film removal liquid is supplied to the edge rinse nozzle 613 and the back rinse nozzle 615 through the supply pipes 613p, 615p, and the metal removal liquid is supplied to the edge rinse nozzle 614 and the back rinse nozzle 616 through supply pipes 614p, 616p. In the present example, a film removal liquid and a metal removal liquid are examples of a third removal liquid, the film removal liquid is an example of a fourth removal liquid, and the metal removal liquid is an example of a fifth removal liquid.

A metal-containing coating film is formed on the substrate W. After that, with the substrate W rotated by the spin chuck 611, the film removal liquid is discharged from the edge rinse nozzle 613 to the peripheral portion of the substrate W, and the film removal liquid is discharged to the back surface of the substrate W from the back rinse nozzle 615. In this case, the coating liquid that has been applied to the peripheral portion and the back surface of the substrate W is dissolved and removed.

Thereafter, with the substrate W rotated by the spin chuck 611, the metal removal liquid is discharged to the peripheral portion of the substrate W from the edge rinse nozzle 614, and the metal removal liquid is discharged to the back surface of the substrate W from the back rinse nozzle 616. In this case, the metallic component remaining on the peripheral portion and the back surface of the substrate W is dissolved and removed.

In this manner, in the spin unit 61 of FIG. 13, the metal-containing coating film is formed on the substrate W, and the coating liquid and the metallic component are removed from the peripheral portion and the back surface of the substrate W. Therefore, it is not necessary to transport the substrate W to the metal removal unit MR. Therefore, a time period required to transport the substrate W can be shortened, and a throughput can be increased. Further, because the metal removal unit MR does not have to be provided, the size of the substrate processing apparatus 100 can be reduced, and the cost of the apparatus can be lowered.

While the edge rinse nozzle 613 for discharging the film removal liquid and the edge rinse nozzle 614 for discharging the metal removal liquid are provided separately from each other in the present example, a common edge rinse nozzle for selectively discharging the film removal liquid and the metal removal liquid may be provided. Similarly, a common back rinse nozzle that selectively discharges the film removal liquid and the metal removal liquid may be provided. Alternatively, the metal removal liquid may have a property of dissolving the coating liquid. In this case, the edge rinse nozzle 613 and the back rinse nozzle 615 do not have to be provided.

A collection unit 61A is provided in the spin unit 61. The collection unit 61A includes a collection pipe DR, collection valves DRv1, DRv2 and collection tanks RTa, RTb. The collection pipe DR is connected to a liquid drainage port of a cup 612. A portion in the downstream of the collection pipe DR branches into two branch pipes DRa, DRb. The collection valves DRv1, DRv2 are provided at the branch pipes DRa, DRb, respectively. The branch pipes DRa, DRb are connected to the collection tanks RTa, RTb, respectively.

The supply valves 613v to 616v and the collection valves DRv1, DRv2 are controlled by the local controller LC1 of FIG. 7, for example. First, the supply valves 613v to 616v and the collection valve DRv2 are closed, and the collection valve DRv1 is opened. After that, the supply valves 615v, 613v are sequentially opened. Thus, the film removal liquid is sequentially discharged to the back surface and the peripheral portion of the substrate W from the back rinse nozzle 615 and the edge rinse nozzle 613.

The film removal liquid that has been discharged to the substrate W is shaken off by the rotation of the substrate W and guided to the downstream of the collection pipe DR from the liquid drainage port of the cup 612. In this case, the collection valve DRv1 of the branch pipe DRa is opened, and the collection valve DRv2 of the branch pipe DRb is closed. Thus, the film removal liquid is collected in the collection tank RTa through the branch pipe DRa. Thereafter, the supply valves 613v, 615v are sequentially closed, so that the discharge of the film removal liquid from the edge rinse nozzle 613 and the back rinse nozzle 615 to the substrate W is sequentially stopped.

Subsequently, the supply valves 616v, 614v are sequentially opened. Thus, the metal removal liquid is sequentially discharged from each of the back rinse nozzle 616 and the edge rinse nozzle 614 to each of the back surface and the peripheral portion of the substrate W. Further, the collection valve DRv1 is closed, and the collection valve DRv2 is opened.

The metal removal liquid that has been discharged to the substrate W is shaken off by the rotation of the substrate W and guided to the downstream of the collection pipe DR from the liquid drainage port of the cup 612. In this case, the collection valve DRv2 of the branch pipe DRb is opened, and the collection valve DRv1 of the branch pipe DR1 is closed. Thus, the metal removal liquid is collected in the collection tank RTb through the branch pipe DRb. Thereafter, the supply valve 613v and the supply valve 616v are sequentially closed, so that the discharging of the metal removal liquid from the edge rinse nozzle 614 and the back rinse nozzle 616 to the substrate W is sequentially stopped.

In this manner, in the present example, the used film removal liquid and the used metal removal liquid are separated from each other based on a period during which the film removal liquid and the metal removal liquid are discharged. Thus, almost all of the used film removal liquid is collected in the collection tank RTa, and almost all of the used metal removal liquid is collected in the collection tank RTb. In this case, it is not necessary for the user to carry out an operation of separating the film removal liquid and the metal removal liquid. Thus, the cost for collecting and discarding the removal liquid can be lowered. A collection tank for collecting the metal-containing coating liquid discharged from the nozzle block 620 of FIG. 3 may be provided separately.

When the cleaning liquid supplied to the above-mentioned waiting pod WP is the same as the film removal liquid supplied to the spin unit 61, the collection tank TA1 of FIG. 4, 6 or 12 may be used as the collection tank RTa. Further, when the metal removal liquid supplied to the waiting pod WP is the same as the metal removal liquid supplied to the spin unit 61, the collection tank TA2 of FIG. 4, 6 or 12 may be used as the collection tank RTb.

Figure 14:
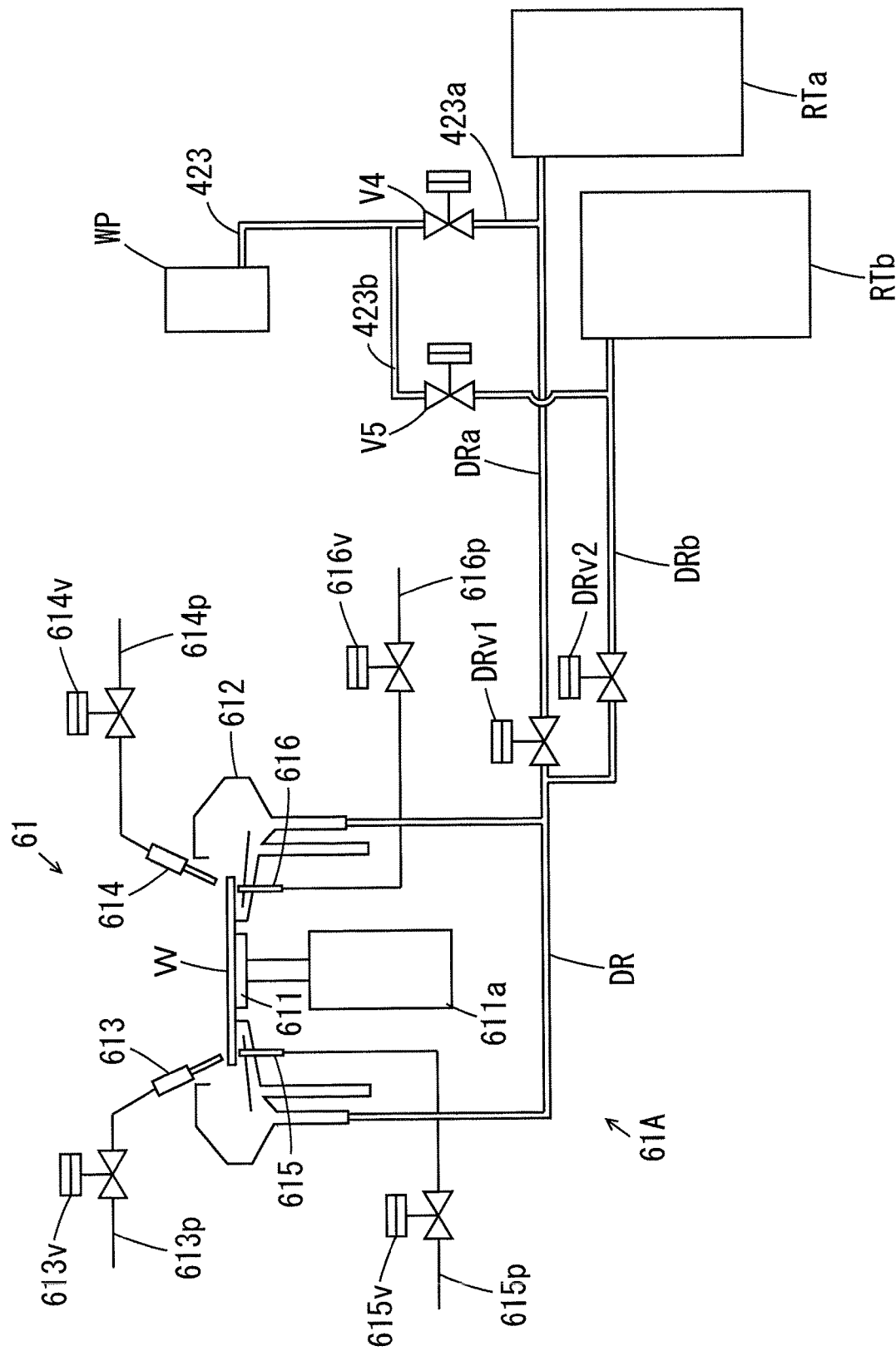
FIG. 14 is a schematic side view for explaining another example of a collection unit.

FIG. 14 is a schematic side view for explaining an example where the collection unit 61A is combined with the configuration for collecting the cleaning liquid and the metal removal liquid from the waiting pod WP.

In the example of FIG. 14, the pipes 423a, 423b extending from the waiting pod WP are connected to the branch pipes DRa, DRb. In this case, the cleaning liquid discharged from the waiting pod WP can be collected in the collection tank DTa, and the metal removal liquid discharged from the waiting pod WP can be collected in the collection tank RTb. In this manner, the configuration for collecting the cleaning liquid and the metal removal liquid from the waiting pod WP is combined with the collection unit 61A. Thus, the cost for collecting and discarding each liquid can be more sufficiently lowered.

Figure 15:
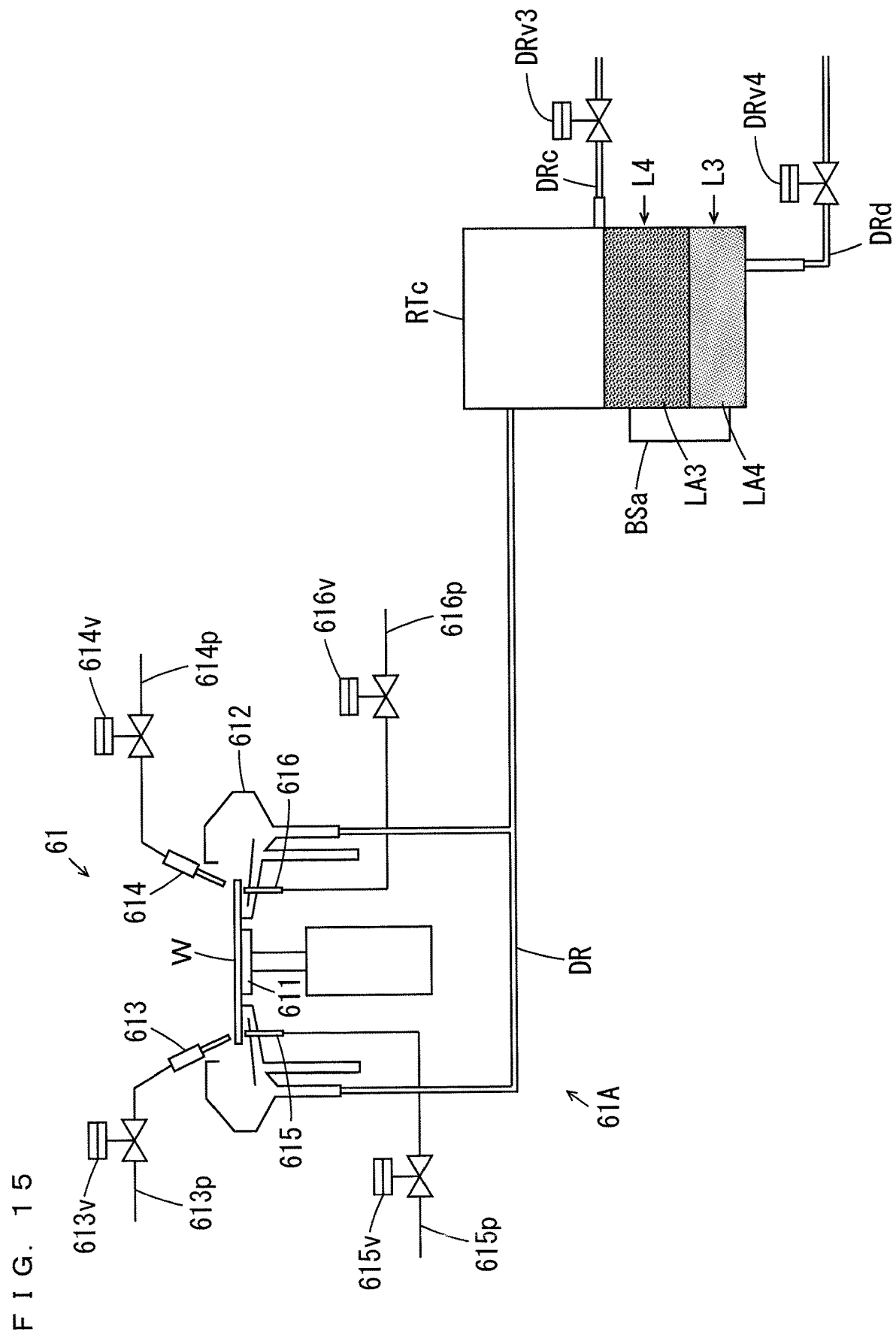
FIG. 15 is a schematic side view for explaining another example of the collection unit.

FIG. 15 is a schematic side view for explaining another example of a collection unit 61A. As for the collection unit 61A of FIG. 15, differences from the collection unit 61A of FIG. 13 will be described.

The collection unit 61A of FIG. 15 includes a collection tank RTc instead of the collection tanks RTa, RTb of FIG. 13. Further, a collection pipe DR does not branch and is connected to the collection tank RTc. In this case, a used film removal liquid and a used metal removal liquid are guided to the common collection tank RTc from a cup 612.

Here, the film removal liquid and the metal removal liquid have specific gravities that are different from each other, and the specific gravity of the metal removal liquid is larger than the specific gravity of the film removal liquid. Therefore, in the collection tank RTc, a layer LA3 of the film removal liquid and a layer LA4 of the metal removal liquid are formed to be separated from each other in the vertical direction. As such, a boundary detector BSa for detecting a boundary surface between the metal removal liquid and the film removal liquid is provided in the collection tank RTc. The boundary detector BSa has a configuration similar to that of the boundary detector BS of FIG. 6.

In the collection tank RTc, a lower limit height L3 and an upper limit height L4 of the boundary surface between the layer LA3 and the layer LA4 are set. The upper limit height L4 is located at a position farther upward than the lower limit height L3. In the collection tank RTc, a collection pipe DRc is attached to a position higher than the upper limit height L4, and a collection pipe DRd is attached to a position lower than the lower limit height L3. The collection pipes DRc, DRd are connected to a film removal liquid collector and a metal removal liquid collector (not shown), respectively. Collection valves DRv3, DRv4 are provided at the collection pipes DRc, DRd, respectively.

For example, when a height of the boundary surface detected by the boundary detector BSa is lower than the lower limit height L3, the collection valve DRv4 is closed. Thus, the film removal liquid is prevented from being discharged from the collection pipe DRd. When a height of the boundary surface detected by the boundary detector BSa is equal to or higher than the lower limit height L3 and lower than the upper limit height L4, the collection valves DRv3, DRv4 are opened. Thus, the film removal liquid and the metal removal liquid are discharged from the collection pipes DRc, DRd, respectively. When a height of the boundary surface detected by the boundary detector BSa is equal to or higher than the upper limit height L4, the collection valve DRv4 is opened, and the collection valve DRv3 is closed. Thus, the metal removal liquid is prevented from being discharged from the collection pipe DRc.

In this manner, in the present example, the used film removal liquid and the used metal removal liquid are separated from each other based on the specific gravities of the film removal liquid and the metal removal liquid. Thus, the film removal liquid and the metal removal liquid can be collected completely separately from each other. In this case, it is not necessary for the user to carry out an operation of separating the film removal liquid and the metal removal liquid. Thus, the cost for collecting and discarding the removal liquid can be lowered.

When the cleaning liquid supplied to the above-mentioned waiting pod WP is the same as the film removal liquid supplied to the spin unit 61, and the metal removal liquid supplied to the waiting pod WP is the same as the metal removal liquid supplied to the spin unit 61, the separate tank TA3 of FIG. 6 may be used as the collection tank RTc. For example, the pipe 423 of FIG. 6 may be connected to the collection pipe DR of FIG. 15.

Further, the film removal liquid and the metal removal liquid that have been supplied to the substrate W may be collected separately from each other with another configuration. For example, the cup 612 may be a two-layer cup that can separately collect two types of removal liquids.

(10) Other Embodiments 10-1

Figure 16:
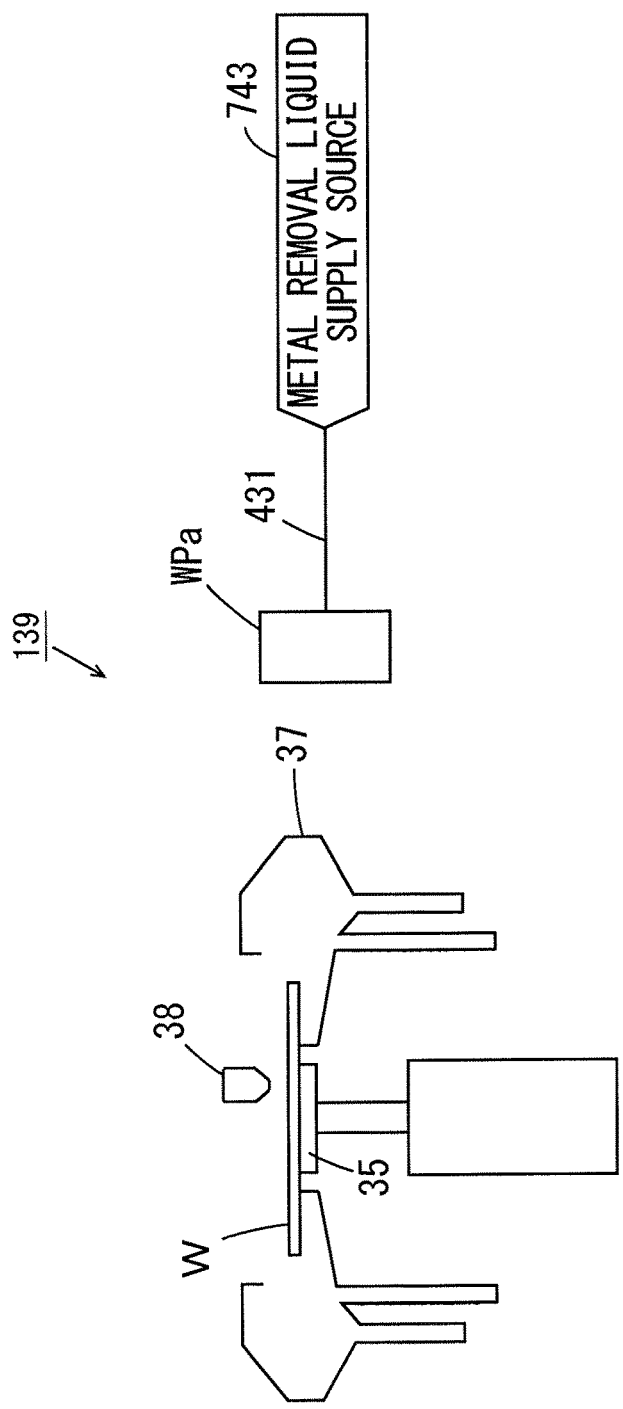
FIG. 16 is a schematic side view for explaining one example of a development processing unit.

While the metal removal liquid is supplied to the nozzle 622 of each coating processing unit 129 in the above-mentioned embodiment, the present invention is not limited to this. For example, the metal removal liquid may be supplied to the slit nozzle 38 (FIG. 1) of each development processing unit 139. FIG. 16 is a schematic side view showing one example of a development processing unit 139. The development processing unit 139 of FIG. 16 includes a waiting pod WPa in which a slit nozzle 38 waits. A metal removal liquid supply source 743 is connected to the waiting pod WPa through a pipe 431.

In the development processing for the substrate W, a development liquid is supplied to the substrate W from the slit nozzle 38, so that part of the metal-containing coating liquid on the substrate W is dissolved. In this case, the metal in the dissolved metal-containing coating film may adhere to the slit nozzle 38. As such, the metal removal liquid is supplied to the slit nozzle 38 in the waiting pod WPa. Thus, the metal adhering to the slit nozzle 38 can be removed. As a result, the metal is prevented from being diffused from the slit nozzle 38.

10-2

While the cleaning processing is performed on the nozzle 622 in the waiting pod WP in which the nozzle block 200 waits in the above-mentioned embodiment, the present invention is not limited to this. A cleaning processing section for performing the cleaning processing on the nozzle 622 may be provided separately from the waiting pod WP. In this case, a nozzle block 620 pre-dispenses liquid while waiting in the waiting pod WP, and the cleaning processing is performed on the nozzle 622 in the cleaning processing section.

While the cleaning of the nozzle 622 by the cleaning liquid and the cleaning of the nozzle 622 by the metal removal liquid are carried out continuously in the above-mentioned embodiment, the present invention is not limited to this. The cleaning of the nozzle 622 by the cleaning liquid may be carried out independently from the cleaning of the nozzle 622 by the metal removal liquid. For example, a time point at which the nozzle 622 is cleaned by the cleaning liquid may be different from a time point at which the nozzle 622 is cleaned by the metal removal liquid. Further, frequency of the cleaning of the nozzle 622 by the cleaning liquid may be different from frequency of the cleaning of the nozzle 622 by the metal removal liquid. Further, the nozzle 622 may be cleaned by the cleaning liquid at a location different from a location where the nozzle 622 is cleaned by the metal removal liquid.

10-3

While the metallic component is contained in both of the anti-reflection liquid and the resist liquid in the above-mentioned embodiment, the present invention is not limited to this. The metallic component does not have to be contained in one of the anti-reflection liquid and the resist liquid. A metallic component may be contained in the coating liquid for forming another film such as a hardmask film (HM). In this case, titanium oxide ($TiO_x$), tungsten oxide ($WO_x$) or zirconium oxide ($ZrO_x$), for example, is contained in the coating liquid as the metallic component.

10-4

While the hands H1 to H3 of the transport mechanisms 127, 128, 137, 138, 141 hold the outer peripheries of the substrates W in the above-mentioned embodiment, the present invention is not limited to this. The hands H1 to H3 of the transport mechanisms 127, 128, 137, 138, 141 may hold the back surfaces of the substrates W by sucking the substrates W.

10-5

While the transport mechanisms 127, 128, 137, 138, 141 preferably have the three hands H1 to H3 in the above-mentioned embodiment, the present invention is not limited to this. The transport mechanisms 127, 128, 137, 138, 141 may have two hands or less or may have four hands or more.

10-6

In the above-mentioned embodiment, the plurality of cleaning drying processing units BSS are arranged in the cleaning drying processing section 161, and the plurality of metal removal units MR are arranged in the cleaning drying processing section 162. However, the present invention is not limited to this. Part or all of the cleaning drying processing units BSS may be arranged in the cleaning drying processing section 162. Part or all of the metal removal units MR may be arranged in the cleaning drying processing section 161.

10-7

While the edge rinse nozzle 613 is provided in each coating processing unit 129 in the above-mentioned embodiment, the present invention is not limited to this. For example, the edge rinse nozzle 613 does not have to be provided in the coating processing unit 129, and the edge rinse nozzle 613 may be provided in the metal removal unit MR. In this case, the film removal liquid and the metal removal liquid are supplied to the peripheral portion of the substrate W in the metal removal unit MR. In order to collect the used film removal liquid and the used metal removal liquid, a collection unit similar to the examples of FIGS. 13 and 15 may be provided in the metal removal unit MR.

10-8

While the edge exposure units EEW are provided in the interface block 14 in the above-mentioned embodiment, the present invention is not limited to this. The edge exposure units EEW do not have to be provided in the interface block 14, and may be provided in the upper thermal processing section 301 and the lower thermal processing section 302 of the first processing block 12. In this case, the resist film is formed, and then the edge exposure processing is performed on the substrate W before the substrate W is placed on the substrate platform PASS5, PASS7.

10-9

The metal removal unit MR may be provided at another location. For example, the metal removal unit MR may be provided in the first or second processing block 12, 13. Further, the metal removal liquid may be supplied to the peripheral portion and the back surface of the substrate W in the development processing unit 139 to remove the metallic component from the peripheral portion and the back surface of the substrate W. Further, another processing block including the metal removal units MR may be arranged between the first processing block 12 and the second processing block 13.

(11) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiments, the coating processing unit 129 or the development processing unit 139 is an example of a film processing unit, the nozzle 622 or the slit nozzle 38 is an example of a processing liquid nozzle, the nozzle transport mechanism 60 or the movement mechanism 39 is an example of a movement mechanism, and the waiting pod WP or the waiting pod WPa is an example of a removal liquid supplier. Further, the spin chuck 611 is an example of a rotation holder, and the nozzle storage container 73 is an example of a storage.

Further, the discharge ports OP1 of FIGS. 4 and 6 are an example of a first opening, the pipe 421 of FIGS. 4 and 6 is an example of a first removal liquid supply system, the discharge ports OP2 of FIGS. 4 and 6 are an example of a second opening, the pipe 422 of FIGS. 4 and 6 is an example of a second removal liquid supply system, the discharge ports OP2 of FIG. 12 are an example of an opening, and the pipe 422 of FIG. 12 is an example of a removal liquid supply system.

Further, the collection unit 400 is an example of a removal liquid collection unit, the edge rinse nozzles 613, 614 are examples of a peripheral portion removal liquid supply unit and a plurality of removal liquid nozzles, the branch pipe DRb is an example of a common collection pipe, the substrate processing apparatus 100 is an example of a substrate processing apparatus, and the development processing unit 139 is an example of a development processing unit.

As each of constituent elements recited in the claims, various other elements having configurations or functions described in the claims can be also used.

INDUSTRIAL APPLICABILITY

The present invention can be effectively utilized for various types of processing.

The invention claimed is:
1. A film processing method comprising:
discharging a metal-containing coating liquid including a metal component and a coating liquid from a processing liquid nozzle to a surface to be processed of a substrate at a process position above the substrate;
moving the processing liquid nozzle between the process position and a cleaning position farther outward than the substrate by a mover;
storing at least part of the processing liquid nozzle in a storage provided at the cleaning position;
discharging a first removal liquid for dissolving the metal component included in the metal-containing coating liquid to an outer surface of the processing liquid nozzle in the storage by a first removal liquid supplier; and
discharging pure water from a position farther upward than a position at which the first removal liquid is discharged to the outer surface of the processing liquid nozzle in the storage by a pure water supplier,
wherein the discharging a first removal liquid includes discharging the first removal liquid through a first flow path and a first opening that are formed in the storage by the first removal liquid supplier connected to the first flow path, the first flow path being directed to the outer surface of the processing liquid nozzle, the first opening being formed to be opposite to the outer surface of the processing liquid nozzle in the storage; and
the discharging pure water includes discharging the pure water through a second flow path and a second opening that are formed in the storage by the pure water supplier connected to the second flow path, the second flow path being located at a position farther upward than the first flow path and directed to the outer surface of the processing liquid nozzle in the storage, the second opening being formed to be opposite to the outer surface of the processing liquid nozzle in the storage and to be located at a position farther upward than the first opening.

2. The film processing method according to claim 1, further comprising holding and rotating the substrate in a horizontal attitude by a rotation holder,
wherein the discharging a metal-containing coating liquid includes forming a metal-containing coating film on the surface to be processed of the substrate by discharging the metal-containing coating liquid from the processing liquid nozzle to the surface to be processed of the substrate rotated by the rotation holder.

3. The film processing method according to claim 1, further comprising supplying a second removal liquid for dissolving the coating liquid to the outer surface of the processing liquid nozzle in the storage by a second removal liquid supplier.

4. The film processing method according to claim 3, wherein the supplying a second removal liquid includes discharging the second removal liquid through the second flow path and the second opening to the outer surface of the processing liquid nozzle in the storage by the second removal liquid supplier connected to the second flow path.

5. The film processing method according to claim 1, wherein the supplying pure water is performed after the supplying a first removal liquid.

6. The film processing method according to claim 4, wherein the discharging a first removal liquid is performed after the discharging the second removal liquid.

7. The film processing method according to claim 4, wherein the discharging a first removal liquid is performed after the discharging the second removal liquid, and the discharging pure water is performed after the discharging a first removal liquid.

8. The film processing method according to claim 3, wherein the supplying a second removal liquid is performed after the discharging a first removal liquid.

9. The film processing method according to claim 1, wherein the first removal liquid includes an alkaline removal liquid, an acid removal liquid, or an aqueous solution including a chelating agent.

10. The film processing method according to claim 3, wherein the second removal liquid includes an organic solvent, an aqueous solution including tetra methyl ammonium hydroxide, or an aqueous solution including ammonia and a hydrogen peroxide solution.

11. The film processing method according to claim 4, further comprising separately collecting the first and second removal liquids that have been supplied to the processing liquid nozzle by a removal liquid collection unit.

12. The film processing method according to claim 1, further comprising discharging the metal-containing coating liquid from the processing liquid nozzle at the cleaning position before the discharging the metal-containing coating liquid from the processing liquid nozzle to the substrate at the process position.

13. The film processing method according to claim 2, further comprising supplying a third removal liquid for dissolving the metal-containing coating liquid to a peripheral portion of the surface to be processed of the substrate that is rotated by the rotation holder such that the metal-containing coating film remains in a region except for the peripheral portion of the surface to be processed of the substrate by a peripheral portion removal liquid supply unit.

14. A film processing method comprising:
discharging a metal-containing coating liquid including a metal component and a coating liquid from a processing liquid nozzle to a surface to be processed of a substrate at a process position above the substrate;
moving the processing liquid nozzle between the process position and a cleaning position farther outward than the substrate by a mover:
storing at least part of the processing liquid nozzle in a storage provided at the cleaning position;
discharging a first removal liquid for dissolving the metal component included in the metal-containing coating liquid through a first flow path and a first opening that are formed in the storage to an outer surface of the processing liquid nozzle in the storage by a first removal liquid supplier connected to the first flow path, the first flow path being directed to the outer surface of the processing liquid nozzle, the first opening being formed to be opposite to the outer surface of the processing liquid nozzle in the storage;
discharging pure water through a second flow path and a second opening that are formed in the storage to the outer surface of the processing liquid nozzle in the storage by a pure water supplier connected to the second flow path, the second flow path being located at a position farther upward than the first flow path and directed to the outer surface of the processing liquid nozzle in the storage, the second opening being formed to be opposite to the outer surface of the processing liquid nozzle in the storage and to be located at a position farther upward than the first opening; and
holding and rotating the substrate in a horizontal attitude by a rotation holder,
wherein the discharging a metal-containing coating liquid includes forming a metal-containing coating film on the surface to be processed of the substrate by discharging the metal-containing coating liquid from the processing liquid nozzle to the surface to be processed of the substrate rotated by the rotation holder,
the third removal liquid includes a fourth removal liquid for dissolving the metal component and a fifth removal liquid for dissolving the coating liquid, and
the supplying a third removal liquid includes supplying the fourth and fifth removal liquids to the peripheral portion of the surface to be processed of the substrate by one or a plurality of removal liquid nozzles of the peripheral portion removal liquid supply unit.

15. The film processing method according to claim 14, wherein the fourth removal liquid is same as the first removal liquid, the film processing method further comprising collecting the first removal liquid that has been supplied to the processing liquid nozzle and the fourth removal liquid that has been supplied to the substrate by a common collection pipe.

* * * * *